(12) United States Patent
Yamaguchi et al.

(10) Patent No.: US 8,638,843 B2
(45) Date of Patent: Jan. 28, 2014

(54) RECEIVING DEVICE AND RECEIVING METHOD

(75) Inventors: Hisakatsu Yamaguchi, Kawasaki (JP); Yasumoto Tomita, Kawasaki (JP); Satoshi Kawahara, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 347 days.

(21) Appl. No.: 13/071,205

(22) Filed: Mar. 24, 2011

(65) Prior Publication Data

US 2011/0299583 A1    Dec. 8, 2011

(30) Foreign Application Priority Data

Jun. 3, 2010   (JP) .................................. 2010-127915
Oct. 29, 2010  (JP) .................................. 2010-243358

(51) Int. Cl.
    *H03H 7/40*    (2006.01)
(52) U.S. Cl.
    USPC ........................................................ 375/232
(58) Field of Classification Search
    USPC ................. 375/232–233, 340, 346, 350; 708/322–323
    See application file for complete search history.

(56) References Cited

U.S. PATENT DOCUMENTS

| 3,593,142 A |   | 7/1971  | Freeny et al. |         |
|-------------|---|---------|---------------|---------|
| 3,742,360 A |   | 6/1973  | Ragsdale      |         |
| 5,475,710 A | * | 12/1995 | Ishizu et al. | 375/232 |
| 6,097,767 A |   | 8/2000  | Lo et al.     |         |
| 6,798,832 B1 | * | 9/2004 | Nakata et al. | 375/233 |
| 2003/0133467 A1 |  | 7/2003 | Navarro et al. |     |
| 2007/0297209 A1 |  | 12/2007 | Hidaka       |         |

FOREIGN PATENT DOCUMENTS

| JP | 6-103696 A    | 4/1994  |
| JP | 2005-517325 A | 6/2005  |
| JP | 2007-325263 A | 12/2007 |

OTHER PUBLICATIONS

USPTO, Non-Final Office Action issued in U.S. Appl. No. 13/153,195, mailed Apr. 5, 2013, 9 pages.

* cited by examiner

*Primary Examiner* — Khanh C Tran
(74) *Attorney, Agent, or Firm* — Arent Fox LLP

(57) ABSTRACT

To optimize an adaptive equalizer with a simple controlling circuit, the receiving device includes a number counting part counting, in a range of detection having a predetermined width, a sampling result corresponding to the input signal being shaped by an equalizer circuit at a determination timing indicated by a clock signal obtained in a CDR circuit, a zone scanning part scanning the range of detection in a scanning zone including a variation range of the input signal; a coefficient altering part altering an equalizer coefficient set to the equalizer circuit; a peak detecting part detecting a peak value of a number of appearances of the sampling result according to alteration of the equalizer coefficient and scanning of the range of detection; and a coefficient specifying part specifying the equalizer coefficient being used when detecting the peak value in the peak detecting part as a first coefficient.

12 Claims, 29 Drawing Sheets

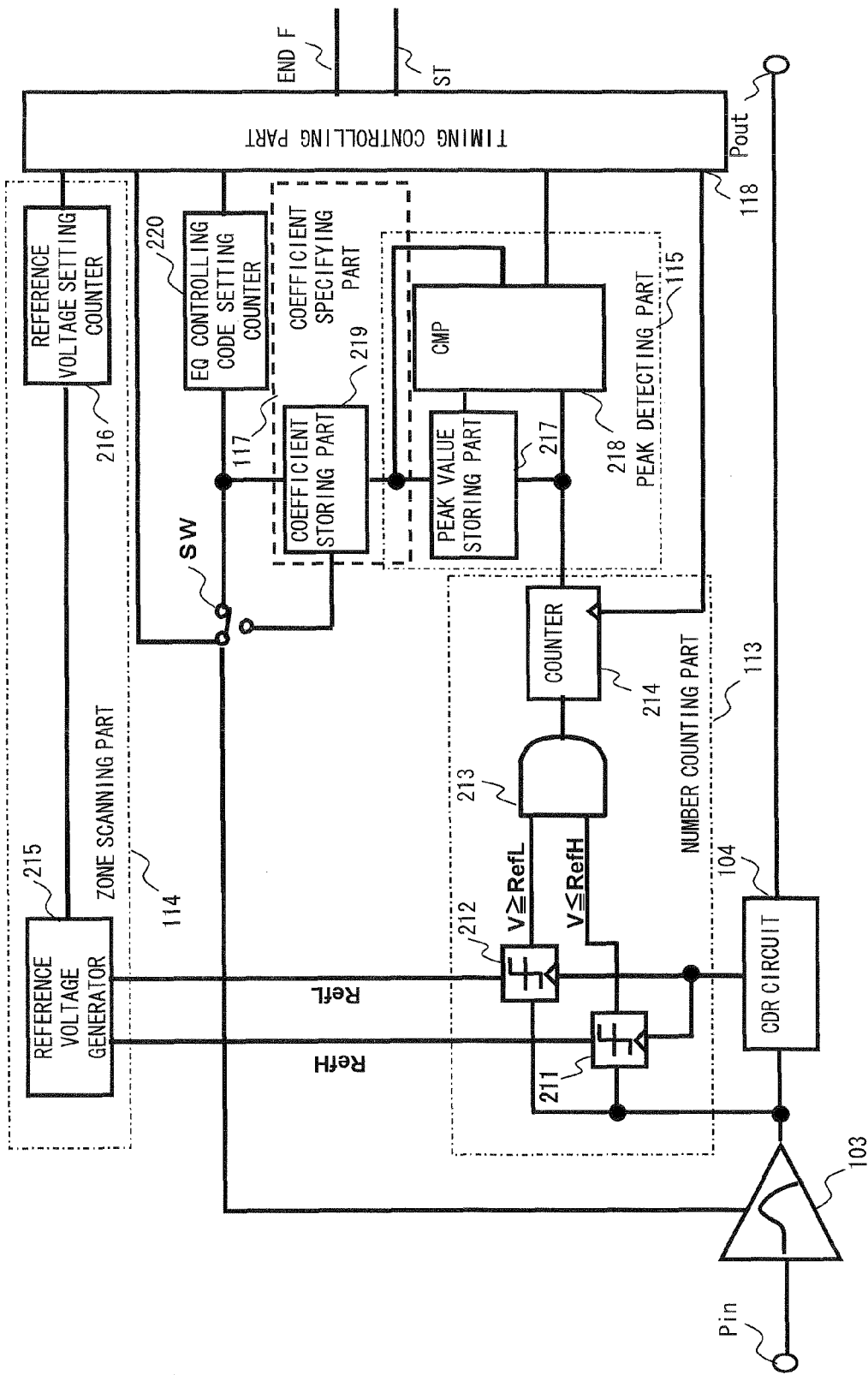

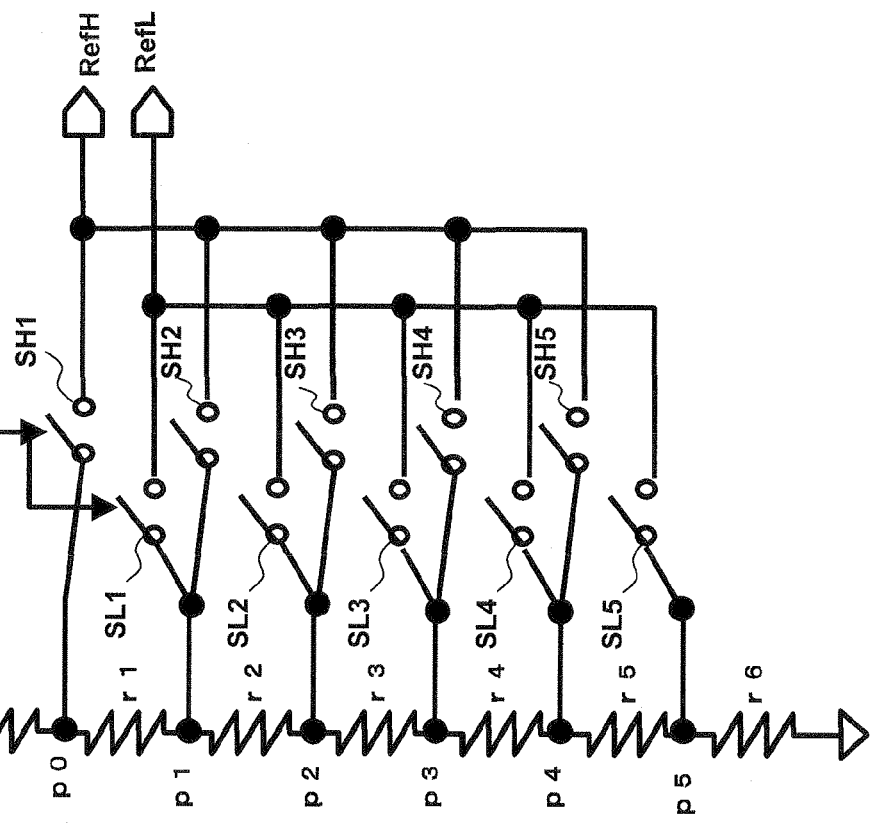

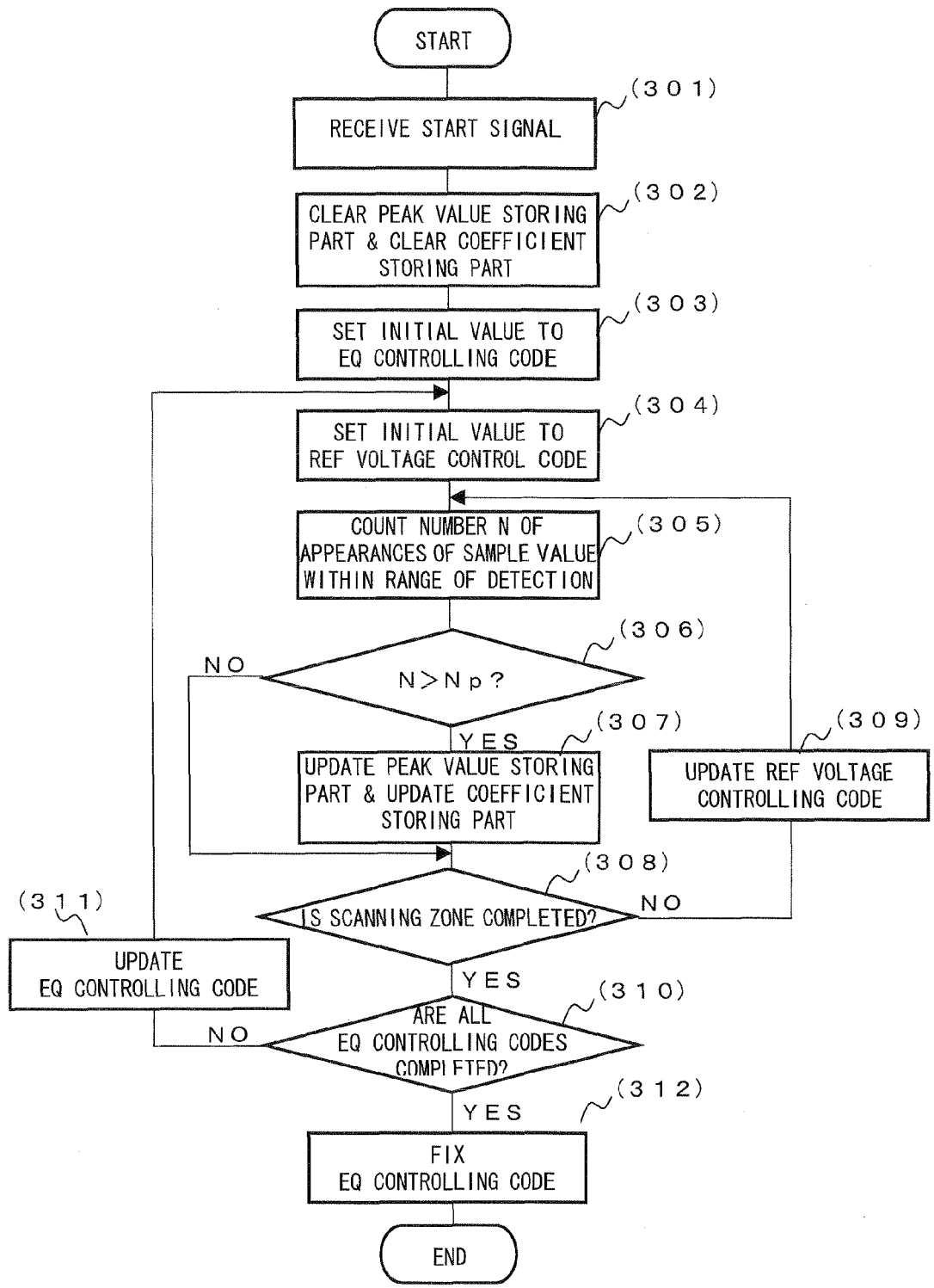

RECEIVING DEVICE AND RECEIVING METHOD

CROSS-REFERENCE TO RELATED APPLICATION

This application is based upon and claims the benefit of priority of the prior Japanese Patent Application No. 2010-243358, filed on Oct. 29, 2010, and the Japanese Patent Application No. 2010-127915, filed on Jun. 3, 2010, the entire contents of which are incorporated herein by reference.

FIELD

The disclosure of the present application relates to a receiving device having an adaptive equalizer provided in a high speed interface for connection in an integrated circuit chip, between chips, and the like, and to a receiving method.

BACKGROUND

To connect chips in an integrated circuit chip or board and chips mounted on different boards, various high speed interfaces are used widely. Examples of such high speed interfaces include Serial-ATA (Advanced Technology Attachment), PCI (Peripheral Component Interconnect)—Express, USB3.0 and 10 Gbit-Ethernet (registered trademark).

A receiving device provided in a high speed interface as described above may have a function to shape the waveform of a received signal which is deteriorated due to attenuation in a transmission path. The function to shape the waveform is achieved by disposing a digital equalizer in a subsequent stage of an analog/digital converting part, or by passing an analog signal which is input via a transmission path to an adaptive equalizer (see, for example, Japanese National Publication of International Patent Application No. 2005-517325 and Japanese Laid-open Patent Publication No. 2007-325263).

FIG. 28 illustrates an example of a conventional receiving device having an adaptive equalizer. Further, FIG. 29 illustrates a diagram describing altering processing in a conventional adaptive equalizer.

In the receiving device having the conventional adaptive equalizer, a high frequency component of an input signal in which the high frequency component has attenuated in the process of passing through a transmission path is emphasized by an adaptive equalizer (equalizer) 401. By this emphasizing operation, the waveform of the input signal is corrected. This corrected signal is input to a CDR (clock and data recovery) circuit 402 and an ADC (analog digital converter) 403. The CDR circuit 402 alters a phase relation between the input signal received via the equalizer 401 and an internal clock of the receiving device. Thus, a clock signal indicating determination timing for determining a logical value of received data is obtained. Further, based on this clock signal, received data containing a correctly determined logical value is output. On the other hand, the ADC 403 samples and quantizes an output of the equalizer 401 in synchronization with the above-described clock signal, and passes the quantization result to a dispersion calculating circuit 404. This dispersion calculating circuit 404 counts the quantization result received from the ADC 403. From a result of this counting, a distribution of signal levels as illustrated in FIG. 29 is obtained. The dispersion calculating circuit 404 calculates a dispersion value with respect to this distribution. Based on the obtained dispersion value, an equalizer coefficient set to the equalizer 401 is controlled. Note that the equalizer coefficient will be abbreviated to EQ coefficient in the following description. For example, the dispersion calculating circuit 404 monitors a change in the above-described dispersion value while varying the EQ coefficient in response to a start signal from a controlling unit, so as to search for the EQ coefficient with which the dispersion value becomes minimum. Completion of this search is notified to the controlling unit by an end flag. After completion of the search, the optimum EQ coefficient found by the search is set fixedly to the equalizer 401. In this way, the amount of the high frequency signal emphasized by the equalizer 401 is altered optimally (Japanese Laid-open Patent Publication No. 06-103696).

Now, in the above-described conventional receiving device, an output voltage value of the equalizer 401 is converted into digital data of a plurality of bits. For this conversion, the ADC 403 having a plurality of comparators is provided in the receiving device. To the comparators provided in the ADC 403, the output of the equalizer 401 and the clock signal generated in the CDR circuit 402 are distributed. Accordingly, for the purpose of ensuring a necessary current amount, a buffer is provided in the conventional receiving device. Further, in the dispersion calculating circuit 404, a complicated calculation circuit is provided for counting the distribution of signal levels and calculating the dispersion thereof. Thus, in the conventional receiving device, numerous comparators, buffers, and calculation circuits are provided for control of the EQ coefficient set to the adaptive equalizer. Large power is consumed by these comparators and calculation circuits.

SUMMARY

A receiving device according to one aspect includes an equalizer circuit shaping a waveform of an input signal according to a equalizer coefficient being set; a CDR circuit recovering, from the input signal being shaped by the equalizer circuit, received data represented by the input signal and a clock signal which indicates a determination timing of the received data; a number counting part counting, in a range of detection having a predetermined width, a sampling result obtained by sampling the input signal being shaped by the equalizer circuit at the determination timing; a zone scanning part scanning the range of detection in a scanning zone including a variation range of a voltage value of the input signal; a coefficient altering part altering the equalizer coefficient set to the equalizer circuit; a peak detecting part detecting a peak value of a number of appearances of the sampling result based on a change in a counting result obtained by the number counting part according to the alteration of the equalizer coefficient and the scanning of the range of detection; and a coefficient specifying part specifying the equalizer coefficient being set to the equalizer circuit when detecting the peak value in the peak detecting part as a first coefficient.

Further, a receiving method according to another aspect includes sampling an input signal shaped by an equalizer circuit at a predetermined determination timing; performing processing of counting the sampling result in a range of detection having a predetermined width which being scanned in a scanning zone including a variation range of a voltage value of the input signal every time an equalizer coefficient set to the equalizer circuit is altered; and performing an optimum control of the equalizer coefficient based on a change in a counting result obtained in the processing of counting according to the alteration of the equalizer coefficient and the scanning of the range of detection.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating another embodiment of the receiving device;

FIGS. 5A and 5B are a diagram and a table illustrating one embodiment of a reference voltage generator;

FIG. 7 is a flowchart representing optimum coefficient searching operation;

DESCRIPTION OF EMBODIMENTS

Hereinafter, embodiments of the present invention will be described in detail based on drawings.

(One Embodiment)

Figure 1:
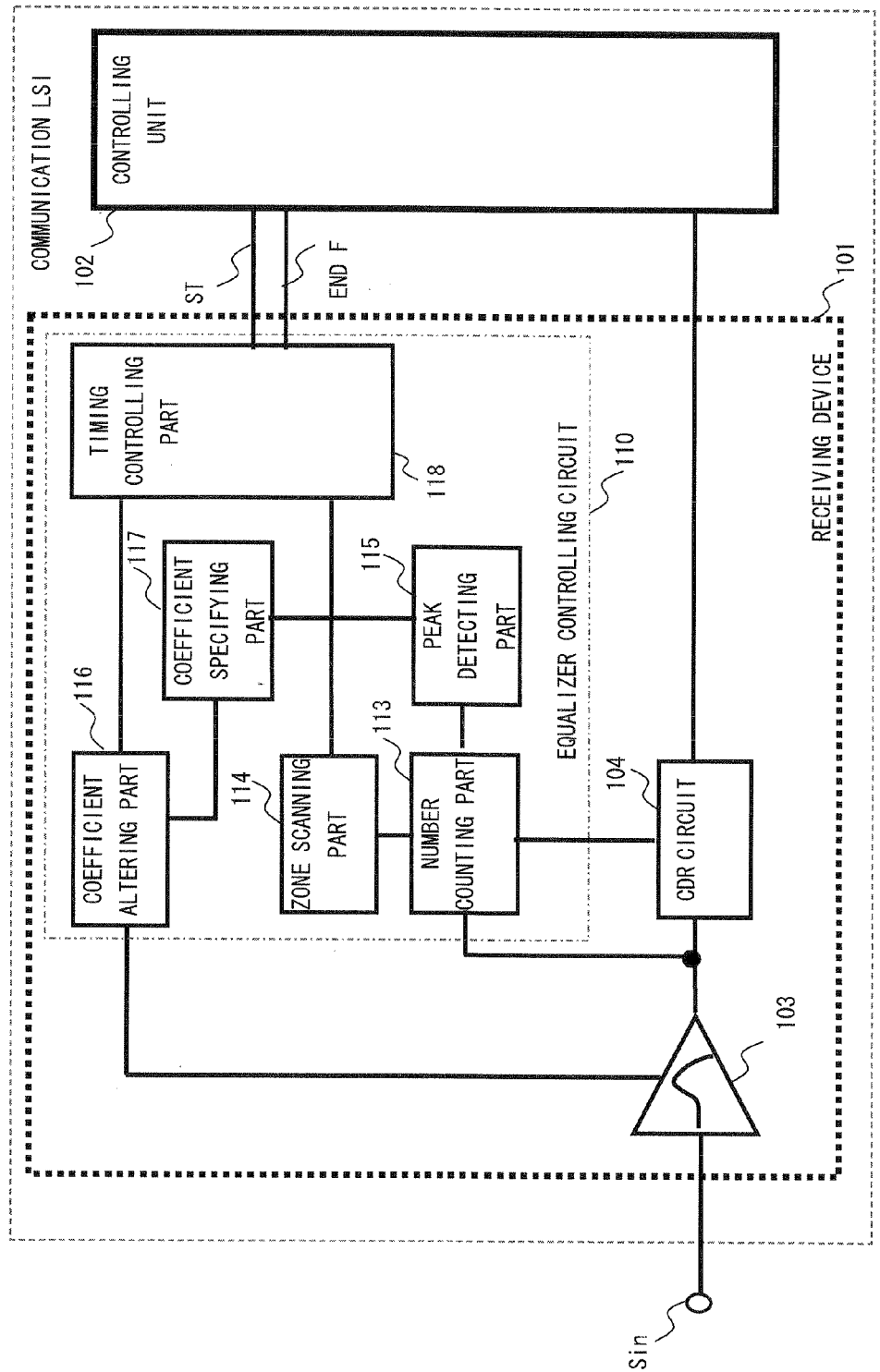
FIG. 1 is a diagram illustrating one embodiment of a receiving device.

FIG. 1 illustrates one embodiment of a receiving device.

A communication LSI illustrated in FIG. 1 has a receiving device 101 and a controlling unit 102. The controlling unit 102 controls the receiving device 101 and a not-illustrated transmitting device. The receiving device 101 has an equalizer 103, a CDR circuit 104, and an equalizer controlling circuit 110. A waveform of an input signal via port Pin to this receiving device 101 is shaped by the equalizer 103. The waveform-shaped input signal is input to the CDR circuit 104. The CDR circuit 104 performs processing of extracting received data from the input signal after being waveform shaped. The received data extracted by the CDR circuit 104 are then passed to the controlling unit 102.

In the equalizer controlling circuit 110, a number counting part 113 receives a clock signal indicating a determination timing used for determining the received data from the CDR circuit 104. This number counting part 113 samples an output signal of the equalizer 103 in synchronization with this clock signal. Further, among sample values obtained in this sampling, the number counting part 113 detects one having a voltage value in a range of detection equivalent to a range of voltage values specified by a zone scanning part 114. Then the number of appearances of a detected sample value is counted by the number counting part 113.

The zone scanning part 114 scans the range of detection indicating a range of sample values to be counted by the number counting part 113, according to an instruction from a timing controlling part 118. A scanning zone for this range of detection is the range corresponds to, for example, the maximum amplitude value of the input signal. Further, a coefficient altering part 116 sequentially outputs all equalizer coefficients (EQ coefficients) which can be set to the equalizer 103, according to an instruction from the timing controlling part 118. The output equalizer coefficients are set to the equalizer 103.

A peak detecting part 115 illustrated in FIG. 1 monitors a change appearing in a counting result output from the number counting part 113 in response to scanning of the range of detection by the above-described zone scanning part 114 and alteration of the EQ coefficient by the coefficient altering part 116. The peak detecting part 115 then detects a maximum counting result through, for example, scanning of the above-described range of detection and alteration of the EQ coefficient. Thus, it is possible to detect the maximum peak in variations of counting results corresponding to scanning of the above-described range of detection and alteration of the EQ coefficient.

When the maximum peak is thus detected by the peak detecting part 115, a coefficient specifying part 117 specifies as an optimum coefficient the EQ coefficient that is set to the equalizer 103 by the coefficient altering part 116 at this time point.

Here, the relation between the degree of achievement of waveform shaping by the equalizer and the counting result obtained by the number counting part 113 in each range of detection within the scanning zone will be described.

Figure 2:
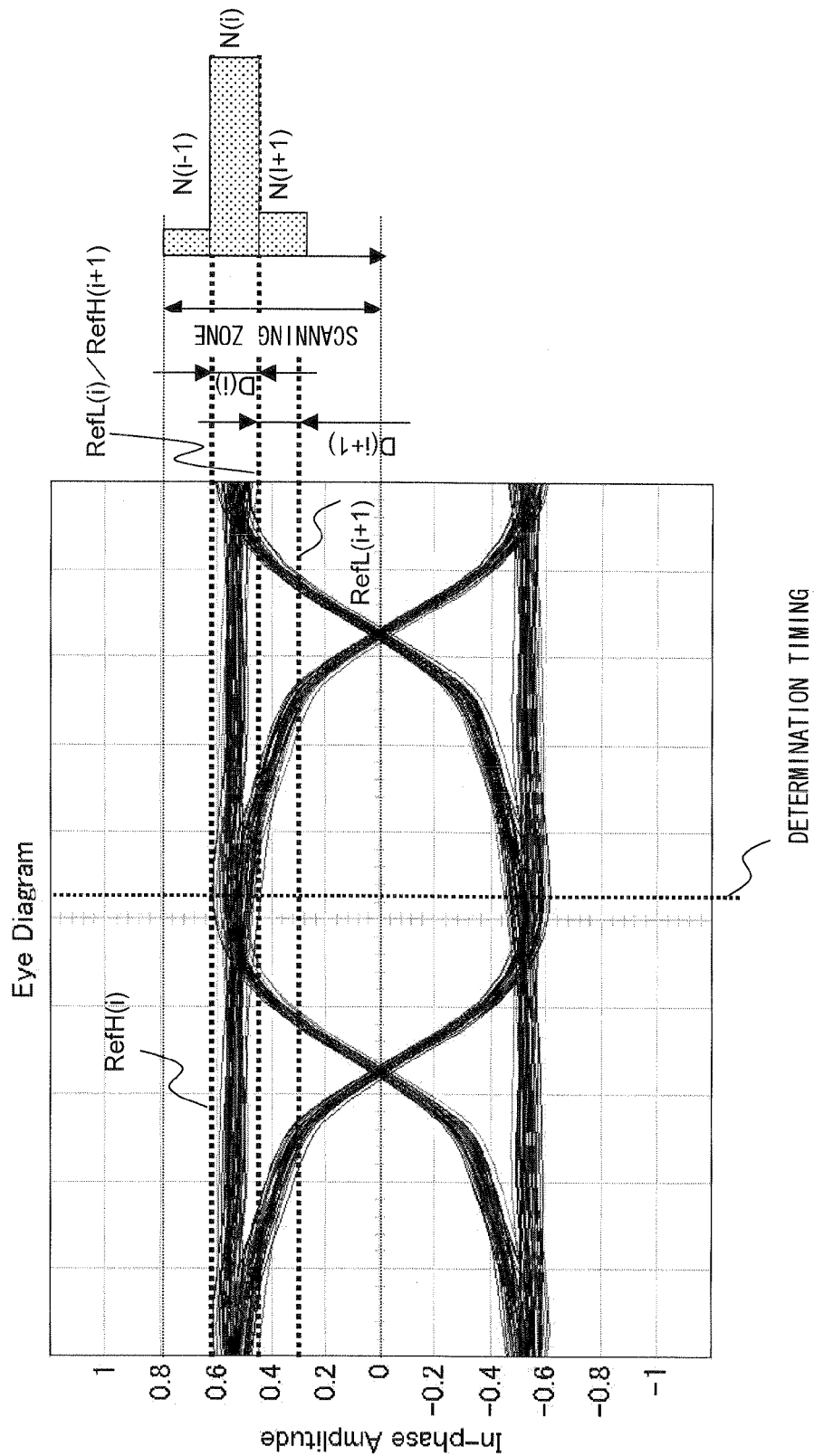
FIG. 2 is a diagram (part 1) describing counting in every range of detection.
Figure 3:
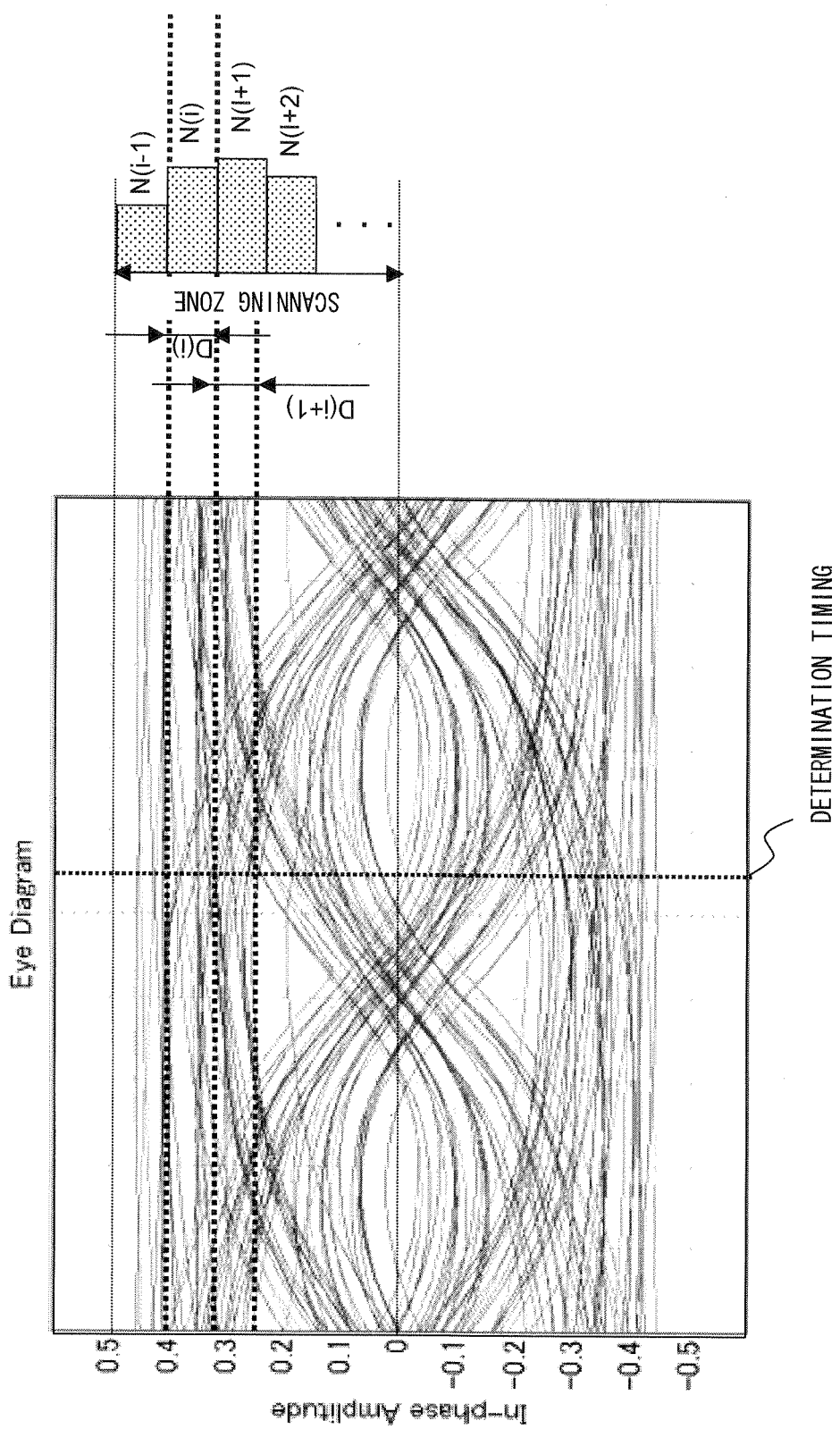
FIG. 3 is a diagram (part 2) describing counting in every range of detection.

FIG. 2 illustrates a diagram (part 1) describing counting in every range of detection. Further, FIG. 3 illustrates a diagram (part 2) describing counting in every range of detection. In FIG. 2 and FIG. 3, an upper-limit reference voltage and a lower-limit reference voltage of the i-th range of detection D(i) are denoted by adding symbols RefH(i), RefL(i), respectively. Similarly, an upper-limit reference voltage and a lower—limit reference voltage of the (i+1)-th range of detection D(i+1) are denoted by adding symbols RefH(i+1), RefL(i+1), respectively. In addition, in adjacent ranges of detection, the lower-limit reference voltage of the immediately preceding range of detection and the upper-limit reference voltage of the next range of detection coincide with each other, and thus are denoted as symbols RefL(i)/RefH(i+1) in FIG. 2 and FIG. 3.

In the eye diagram illustrated in FIG. 2, sample values obtained by sampling at the determination timing mostly converge to the range of detection D(i). In this example, the degree of achievement of waveform shaping on the input signal is high. Specifically, when the degree of achievement of waveform shaping is high, the appearance number distribution of sample values detected in respective ranges of detection has a sharp, high peak as in the histogram illustrated on the right side of the eye diagram in FIG. 2.

On the other hand, in the eye diagram illustrated in FIG. 3, sample values obtained by sampling at the determination timing are distributed to disperse across the entire scanning zone. When such an eye diagram is seen, it cannot be said that the degree of achievement of waveform shaping on the input signal is high. In this case, the appearance number distribution of sample values detected in respective ranges of detection changes gently as in the histogram illustrated on the right side of the eye diagram in FIG. 3. Moreover, the peak value thereof is clearly smaller than that in the histogram illustrated in FIG. 2.

Thus, the height of the peak of the number distribution obtained for sampling results at the determination timing has a high correlation with the degree of achievement of waveform shaping on the input signal. Therefore, instead of the dispersion of a number distribution in conventional techniques, the peak value of a number distribution may be used as an index when searching for an optimum EQ coefficient.

By using the peak value of number distribution obtained for sampling results at the determination timing as an index, the structure of the equalizer controlling circuit 110 can be simplified more than when the dispersion of a number distribution is obtained.

Hereinafter, a method of optimizing the EQ coefficient set to the equalizer 103 based on the peak value of the above-described number distribution will be described.

(Another Embodiment)

FIG. 4 illustrates another embodiment of the receiving device. Note that among components illustrated in FIG. 4, components equivalent to those illustrated in FIG. 1 are denoted by the same symbols, and descriptions thereof are omitted. In FIG. 4, the CDR circuit 104 outputs the received data which being recovered via port denoted Pout.

The number counting part 113 illustrated in FIG. 4 includes two comparators 211, 212, an AND gate 213, and a counter 214. The above-described two comparators 211, 212 sample outputs of the equalizer 103 in synchronization with the clock signal received from the CDR circuit 104. Then the comparator 211 compares an upper-limit reference voltage RefH specified by the zone scanning part 114 with a sample value V obtained by sampling. When the sample value V is equal to or less than the upper-limit reference voltage RefH, logic "H" is output by the comparator 211. On the other hand, the comparator 212 compares a lower-limit reference voltage RefL specified by the zone scanning part 114 with the sample value V. When the sample value V is equal to or more than the lower-limit reference voltage RefL, logic "H" is output by the comparator 212. That is, the comparator 211 is an example of an upper-limit comparator comparing the sampling result with the upper-limit reference voltage. Further, the comparator 212 is an example of a lower-limit comparator comparing the sampling result with the lower-limit reference voltage.

Outputs of the two comparators 211, 212 are input to the counter 214 via the AND gate 213. Thus, the number of times of obtaining a sampling result having a voltage value within the range of detection indicated by the upper-limit reference voltage RefH and the lower-limit reference voltage RefL is counted. That is, this counter 214 is an example of a range counter selectively counting a sampling result within the range of detection indicated by the upper-limit reference voltage and the lower-limit reference voltage. In addition, the clock signal for counting the number is input from the timing control part 118 to this counter 214. Further, depending on the output logic of the comparators 211, 212, the input to the AND gate 213 may be negative logic.

Further, the zone scanning part 114 illustrated in FIG. 4 includes a reference voltage generator 215 and a reference voltage setting counter 216. The reference voltage generator 215 receives, for example, a count value of the reference voltage setting counter 216 as a reference voltage controlling code (REF controlling code). The reference voltage generator 215 then outputs the upper-limit reference voltage RefH and the lower-limit reference voltage RefL corresponding to the received REF controlling code.

FIGS. 5A and 5B illustrate one embodiment of the reference voltage generator. Specifically, FIG. 5A illustrates an example of the reference voltage generator. Further, FIG. 5B illustrates a table describing a control example of the REF controlling code and the reference voltage generator.

In the reference voltage generator 215 illustrated in FIG. 5A, by resistor elements r0 to r6 coupled in series, terminals to which predetermined voltage Vdd is supplied and terminals to which ground potential is given are coupled. Among coupling points p0 to p5 of the resistor elements r0 to r6, coupling points p0 to p4 are coupled to an output terminal RefH via switches SH(i) (i=1 to 5). Further, coupling points p1 to p5 are coupled to an output terminal RefL via switches SL(i) (i=1 to 5). In response to input of the REF controlling code, a corresponding i-th pair of switches SL(i), SH(i) is selectively turned on. Accordingly, the potential corresponding to a coupling point p and the potential corresponding to a coupling point are output as the lower-limit reference voltage RefL and the upper-limit reference voltage RefH, respectively.

In this manner, the upper-limit reference voltage RefH(i) and the lower-limit reference voltage RefL(i) which correspond to the range of detection D(i) indicated by the REF controlling code may be generated. The generated upper-limit reference voltage RefH(i) and the lower-limit reference voltage RefL(i) are input to the above-described two comparators 211, 212. In addition, in the examples illustrated in FIGS. 5A and 5B, there are five divisions between the potential appearing at the coupling point p0 and the potential appearing at the coupling point p5. An amount of dropped voltage due to the respective resistor elements r0 to r5 is correlated with each range of detection. The number of ranges of detection dividing the scanning zone is not limited to the example illustrated in FIGS. 5A and 5B, and the scanning zone may be divided into more ranges of detection.

Further, the peak detecting part 115 illustrated in FIG. 4 includes a peak value storing part 217 and a comparator (CMP) 218. To the peak value storing part 217, the count value from the above-described counter 214 is input. The comparator 218 instructs the peak value storing part 217 to perform update when the count value output newly from the counter 214 is larger than the peak value up to this point which is stored in the peak value storing part 217. Thus, it is possible to allow the peak value storing part 217 to store the maximum peak value. The structure to set the count value from the counter 214 in the peak value storing part 217 based on the output of the comparator 218 in this manner is an example of a peak updating part performing update of the peak value storing part 217.

On the other hand, to a coefficient storing part 219 provided in the coefficient specifying part 117 illustrated in FIG. 4, an equalizer controlling code (EQ controlling code) output from an equalizer (EQ) controlling code setting counter 220 is input. Incidentally, the EQ controlling code setting counter 220 is an example of the coefficient altering part 116. This coefficient storing part 219 stores the input EQ controlling code at a timing the above-described comparator 218 updates the peak value storing part 217. By this operation, the EQ controlling code corresponding to the detected maximum peak value is stored in the coefficient storing part 219. That is, the circuit structure which updates the coefficient storing part 219 based on the output of the comparator 218 is an example of a coefficient updating part which updates the coefficient storing part 219 in response to update of the above-described peak value storing part 217.

Here, the EQ controlling code corresponds to the equalizer coefficient set to the equalizer 103. For example, setting information of a variable capacitor and a variable resistor included in the equalizer 103 may be used as the EQ controlling code.

Figures 6A, 6B:
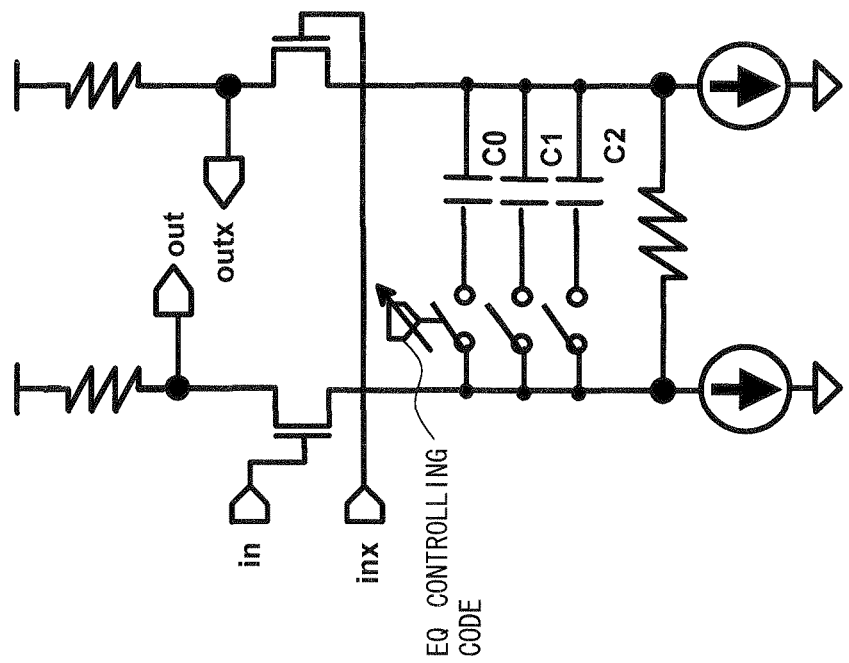
FIGS. 6A and 6B are a diagram and a table illustrating one embodiment of an equalizer.

FIGS. 6A and 6B illustrate one embodiment of the equalizer. In addition, in a structural example illustrated in FIG. 6A, the capacitance of a variable capacitor including three capacitors C0, C1, C2 is controlled by operating corresponding switches according to the EQ controlling code. Further, FIG. 6B illustrates an example of a correspondence between three-bit EQ controlling codes and respective capacitors.

In the example illustrated in FIGS. 6A and 6B, the EQ controlling code corresponding to the count values 0 to 7 of the EQ controlling code setting counter 220 is input. According to this EQ controlling code, the corresponding capacitors are selectively made to contribute to the waveform shaping operation by the equalizer 103, thereby setting the EQ coefficient. In addition, the variable capacitor provided in the equalizer 103 may also include a circuit in which three or more capacitors and corresponding switches are coupled in parallel between two transistors. Further, the equalizer 103 may include a variable resistor. In either case, the EQ coefficient corresponding to the EQ controlling code can be set by operating corresponding switches according to the EQ controlling code to make specified capacitor and resistor element to contribute to the function of the equalizer 103. That is, in the example of the equalizer illustrated in FIGS. 6A and 6B, the circuit switching ON/OFF of the three switches corresponding to the respective capacitors C0, C1, C2 is an example of a configuration changing part.

Next, a method of searching for the EQ controlling code corresponding to the optimum EQ coefficient will be described. In a search described below, scanning of the range of detection is performed by the reference voltage setting counter 216 while EQ controlling codes are generated in a round robin manner by the EQ controlling code setting counter 220.

Figure 8:
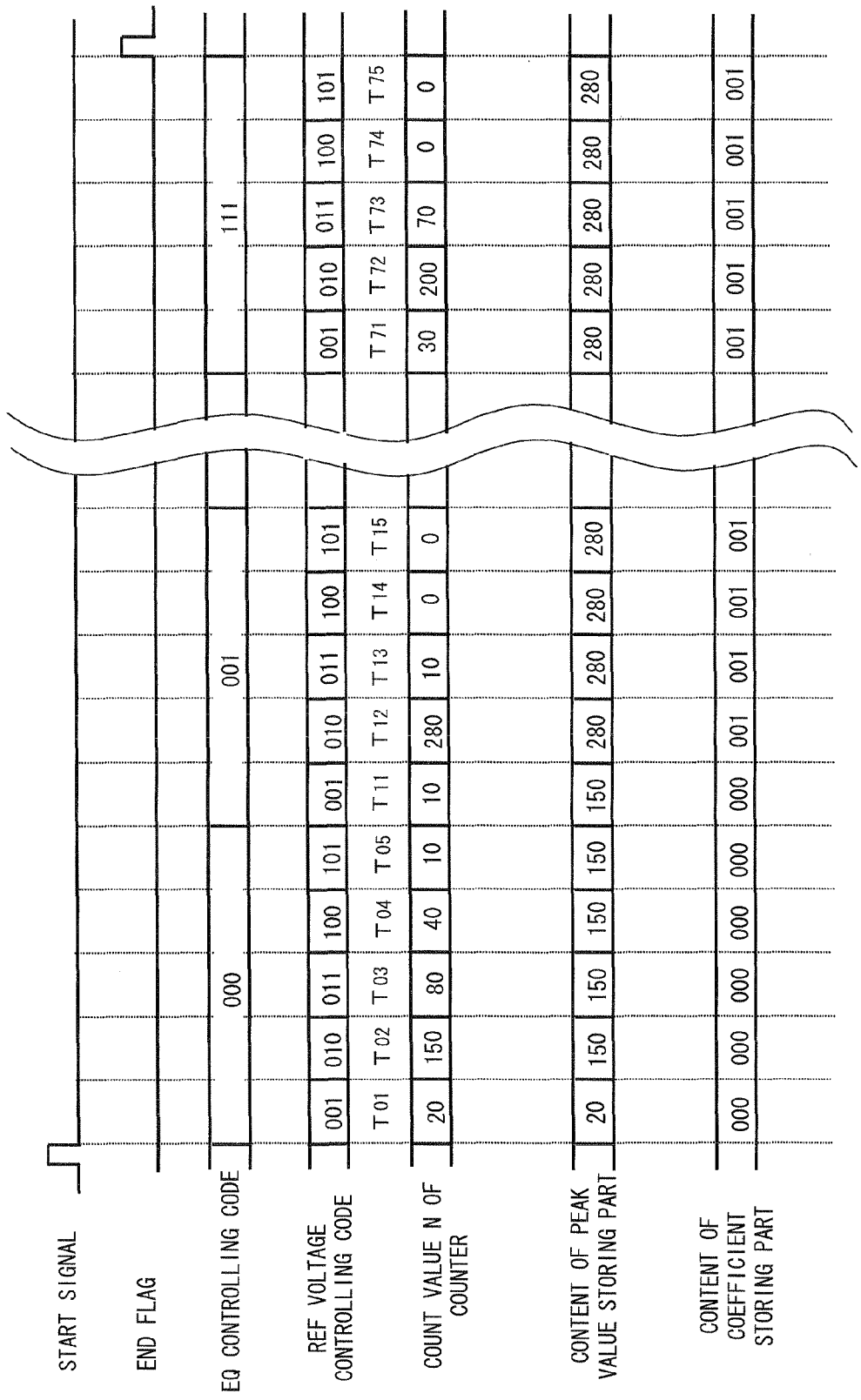
FIG. 8 is a timing chart describing the optimum coefficient searching operation.

FIG. 7 illustrates a flowchart representing processing of searching for the optimum coefficient. Further, FIG. 8 illustrates a timing chart describing processing of searching for the optimum coefficient. In the following description, there is illustrated an example of performing the processing of searching for the optimum coefficient while a test signal is input, which is used for training when altering the equalizer. However, it is needless to mention that similar processing may be performed by a signal other than the test signal used for training, for example, a data signal during a normal operation.

Prior to input of the test signal, a start signal (denoted ST in FIG. 1) is transmitted from the controlling unit 102 illustrated in FIG. 1. In response to this start signal, the timing controlling part 118 included in the equalizer controlling circuit 110 of the receiving device 101 clears the peak value storing part 217 and the coefficient storing part 219 (steps 301, 302). Thus, the peak value storing part 217 stores an initial value "0" of peak value Np. Next, the timing controlling part 118 sets initial values to the EQ controlling code and the REF controlling code, respectively (steps 303, 304). For example, the timing controlling part 118 may set an initial value [000] to the EQ controlling code by resetting the EQ controlling code setting counter 220. Then, according to this EQ controlling code, setting of the variable capacitor of the equalizer 103 is performed (see FIGS. 6A and 6B). Further, the timing controlling part 118 sets an initial value [001] to the count value of the reference voltage setting counter 216. By this initial value, the value corresponding to the range of the highest voltage value among the plural ranges of detection included in the scanning zone is set to the REF controlling code. In response to input of this REF controlling code, the reference voltage generator 215 generates the lower-limit reference voltage RefL and the upper-limit reference voltage RefH corresponding to the above-described range of detection. The generated lower-limit reference voltage RefL and upper-limit reference voltage RefH are input to the comparators 211, 212, respectively. In addition, FIG. 8 illustrates an overview that the initial value [000] and the initial value [001] are set to the EQ controlling code and the REF controlling code, respectively, in response to input of the start signal.

Thereafter, the timing controlling part 118 starts input of the clock signal for counting the number to the counter 214 illustrated in FIG. 4. In response to this, the counter 214 starts counting of the number N of appearances of a sample value within the range of detection illustrated in the above-described REF controlling code (step 305). Then, when a predetermined counting period T has passed, the timing controlling part 118 notifies this to the comparator 218 of the peak detecting part 115. In response to this notification, the comparator 218 compares the count value N of the above-described counter 214 with the peak value Np stored in the peak value storing part 217 (step 306).

When the count value N is larger than the peak value Np (affirmative judgment in step 306), the peak value storing part 217 and the coefficient storing part 219 are updated corresponding to the comparison result in the comparator 218 (step 307). For example, in the counting period denoted by adding symbol $T_{01}$ in FIG. 8, the peak value Np is cleared in the beginning of this period, and thus affirmative judgment is made in step 306. Then, the peak value Np of the peak value storing part 217 is updated with a numerical value "20" corresponding to the count value N of the counter 214 in the end of this counting period Tot. Further, at this time, the coefficient storing part 219 is updated using the EQ controlling code used for setting the equalizer 103 at this time point. Note that in the description of FIG. 8 and thereafter, each counting period is denoted by adding a subscript combining symbol T with number 0 to 7 corresponding to the EQ controlling code and number 1 to 5 corresponding to the REF controlling code.

That is, the subscript added to symbol T denoting a counting period denotes a combination of the EQ controlling code and the REF controlling code which are applied in this counting period.

On the other hand, when the count value N is equal to or less than the peak value Np (negative judgment in step 306), above-described step 307 is skipped. In this case, the contents of the peak value storing part 217 and the coefficient storing part 219 are maintained as they are.

Thereafter, the timing controlling part 118 compares, for example, the count value of the reference voltage setting counter 216 with the number of all ranges of detection provided in the scanning zone. When the count value is less than the number of ranges of detection, it is judged that counting in the scanning zone is not completed (negative judgment in step 308). In this case, the timing controlling part 118 increments, for example, the reference voltage setting counter 216 to update the REF controlling code (step 309). Thereafter, processing returns to step 305, starting processing of a new range of detection.

By repeating step 305 to step 309, processing for the respective ranges of detection is performed. Thereafter, when processing for all the ranges of detection in the scanning zone is completed (affirmative judgment in step 308), processing proceeds to step 310. In step 310, the timing controlling part 118 judges that there is unprocessed EQ controlling code when, for example, the count value of the EQ controlling code setting counter 220 is smaller than the maximum number represented by the EQ controlling code (negative judgment of step 310).

In this case, the timing controlling part 118 increments, for example, the EQ controlling code setting counter 220 to update the EQ controlling code (step 311). Next, processing returns to step 304, starting processing for a new EQ controlling code. In this manner, by repeating step 304 to step 310, processing of searching for the above-described optimum coefficient is performed while scanning the ranges of detection across the scanning zone regarding each EQ controlling code.

In the example illustrated in FIG. 8, after the peak value storing part 217 is updated in the counting period $T_{02}$, the peak value Np is maintained until the counting period $T_{11}$ corresponding to the next EQ controlling code [001]. Then, when the peak value storing part 217 is updated based on the count value N of the counter in the counting period $T_{12}$, the coefficient storing part 219 is updated with the above-described EQ controlling code [001]. As illustrated in the example illustrated in FIG. 8, when a peak higher than the peak value Np stored in the peak value storing part 217 is not detected thereafter, the EQ controlling code stored in the coefficient storing part 219 is maintained as it is, and this becomes a search result for the optimum coefficient. In addition, in the example illustrated in FIG. 8, a preliminary period until output of the equalizer 103 becomes stable after the EQ controlling code is updated is omitted. It is desired that such a preliminary period be provided every time the EQ controlling code is updated. Further, the preliminary period may be provided by performing, for example, control to halt the clock signal which is input from the timing controlling part 118 to the counter 214 of the number counting part 113.

When the search processing is completed thus (affirmative judgment in step 310), the timing controlling part 118 operates a switch SW. By operating this switch SW, the EQ controlling code in the coefficient storing part 219 is input to the equalizer 103 instead of the output of the EQ controlling code setting counter 220. Accordingly, the EQ controlling code set to the equalizer 103 is fixed corresponding to the optimum coefficient (step 312). Further, at this time, the timing controlling part 118 notifies completion of alteration of the equalizer 103 to the controlling unit 102 by an end flag (denoted END-F in FIG. 1), thereby finishing the processing.

In the receiving device illustrated in FIG. 4, the equalizer controlling circuit is a simple circuit using counters, comparators, and so on. By this equalizer controlling circuit, the EQ controlling code for setting the optimum EQ coefficient to the equalizer 103 can be specified. In addition, the timing controlling part 118 may be achieved using a timer circuit and the like.

Further, in the example illustrated in FIG. 4, the output of the equalizer 103 and the clock signal generated in the CDR circuit 104 may be distributed to the two comparators 211, 212. Therefore, in the receiving device as illustrated in FIG. 4, power consumption can be suppressed as compared to the case where the output of the equalizer 103 and the clock signal are distributed to an ADC including numerous comparators. Further, in the structure of the number counting part 113 using the comparators 211, 212, the area occupied by the receiving device in the communication LSI can be made small, compared to a conventional structure using the ADC.

Therefore, by employing the architecture illustrated in FIG. 4, size reduction can be achieved along with reduction in power consumption of the receiving device. This capability of achieving power consumption reduction and size reduction is a highly advantageous feature in the field of high speed interfaces and the like.

Note that the basic structure of the receiving device illustrated in FIG. 1 can also be achieved by using a number counting part different from that of the example illustrated in FIG. 4. Hereinafter, a structural example different from the above-described number counting part 113 will be described.

(Still Another Embodiment)

Figure 9:
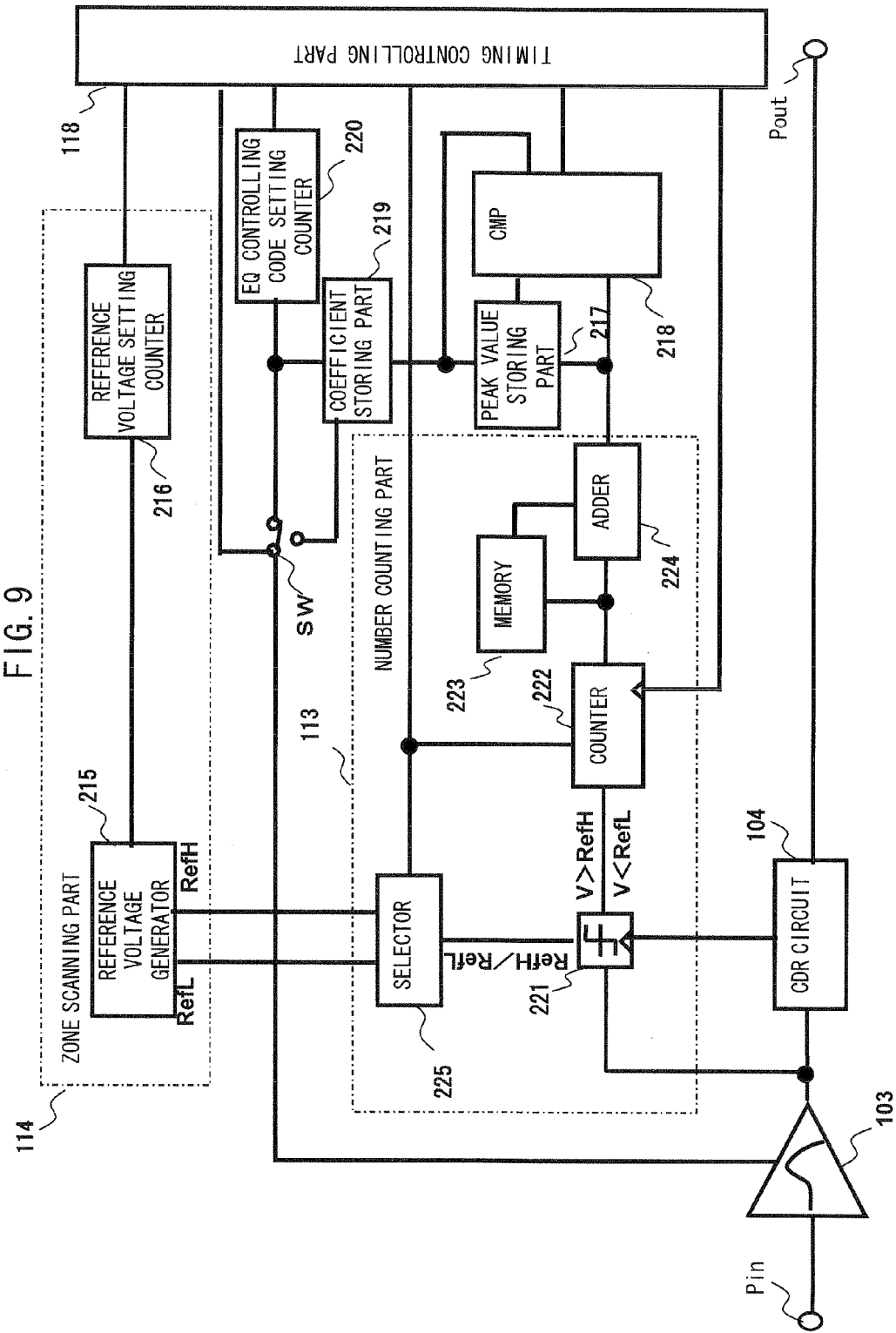
FIG. 9 is a diagram illustrating another embodiment of a number counting part.

FIG. 9 illustrates another embodiment of the number counting part. Note that among components illustrated in FIG. 9, components equivalent to those illustrated in FIG. 1 and FIG. 4 are denoted by the same symbols, and descriptions thereof are omitted.

The number counting part 113 illustrated in FIG. 9 includes a comparator 221, a counter 222, a memory 223, an adder 224, and a selector 225. The upper-limit reference voltage RefH and the lower-limit reference voltage RefL generated by the reference voltage generator 215 are input to the comparator 221 via the selector 225. This selector 225 alternately outputs the upper-limit reference voltage RefH and the lower-limit reference voltage RefL according to a switching signal from the timing controlling part 118. Therefore, the upper-limit reference voltage RefH and the lower-limit reference voltage RefL alternately become a reference voltage for the comparator 221. Thus, in the example of FIG. 9, the comparator 221 compares the reference voltage switched in a time-division manner according to the switching signal with an input signal. Such a circuit structure is an example of an outrange detector detecting a sampling result which is out of the range of detection indicated by the upper-limit reference voltage RefH and the lower-limit reference voltage RefL.

Further, the counter 222 counts an output of the comparator 221 indicating that a sample value V obtained by sampling an output of the equalizer 103 is larger than the reference voltage, when the above-described switching signal indicates that the upper-limit reference voltage RefH is the reference voltage. On the other hand, the counter 222 counts an output of the comparator 221 indicating that the sample value V is smaller than the reference voltage, when the above-described switching signal indicates that the lower-limit reference voltage RefL is the reference voltage. The circuit structure in which the counter 222 performs a counting operation according to the switching signal in this manner is an example of an outrange counter counting a sampling result distributed outside the above-described range of detection. Further, a count value obtained in the counter 222 is added by the memory 223 and the adder 224 according to the switching signal.

That is, in the number counting part 113 illustrated in FIG. 9, among sample values V obtained by sampling outputs of the equalizer 103 for each range of detection set by the REF controlling code, the number of appearances of a sample value V having a value which is out of this range of detection is counted.

Figure 10:
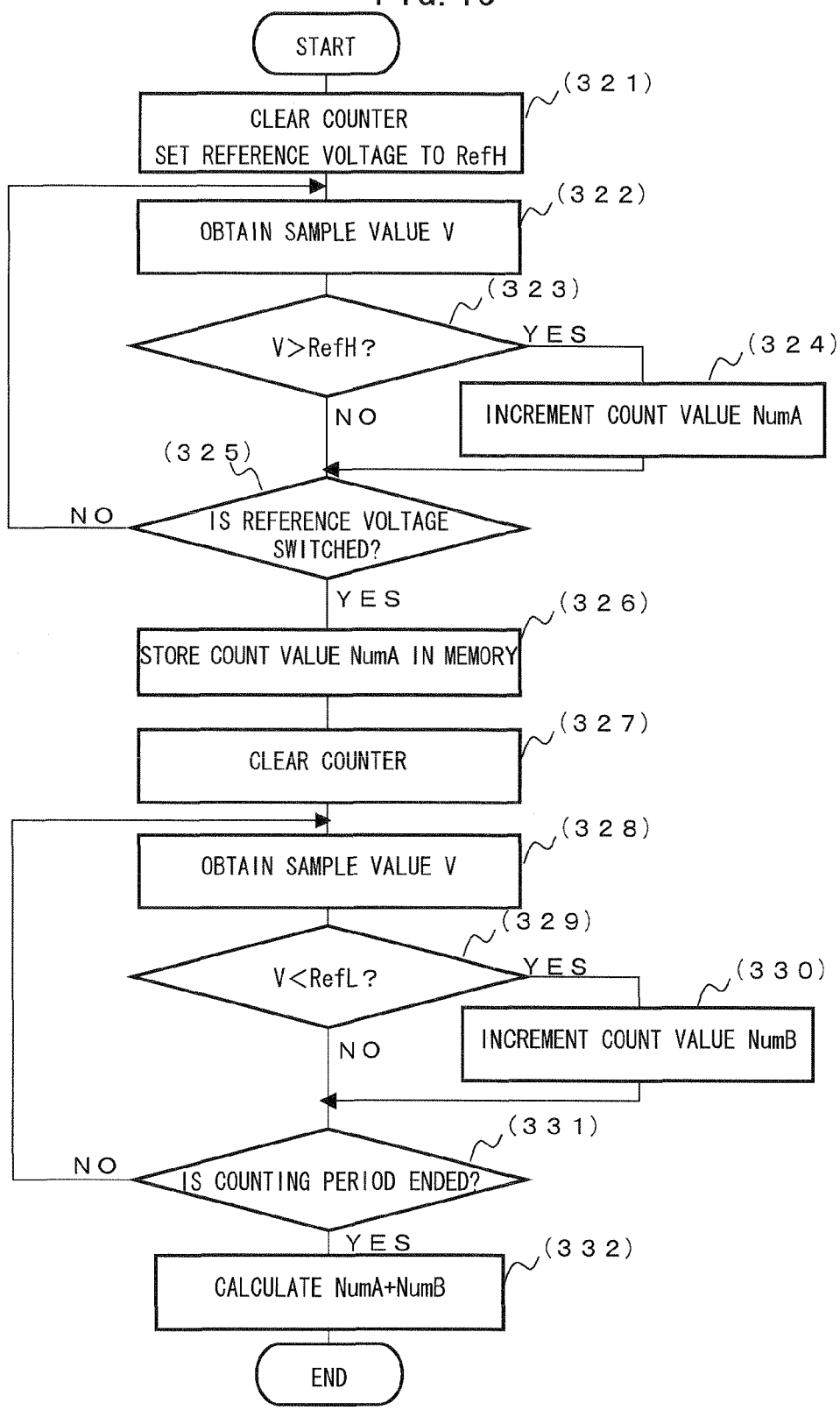
FIG. 10 is a flowchart representing operation of the number counting part.

FIG. 10 illustrates a flowchart representing operation of the number counting part.

Figure 11:
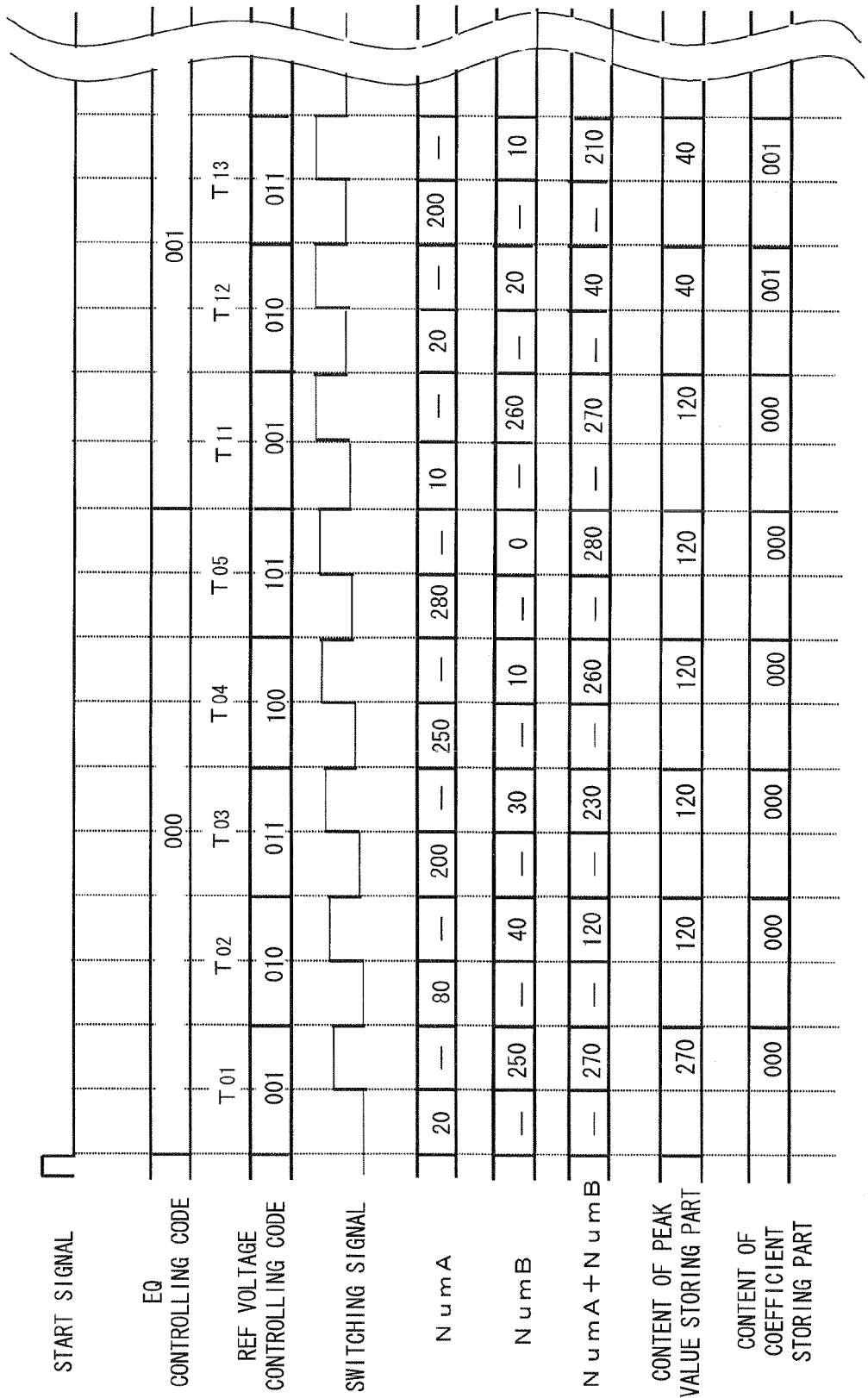
FIG. 11 is a timing chart describing number counting operation.
Figure 12:
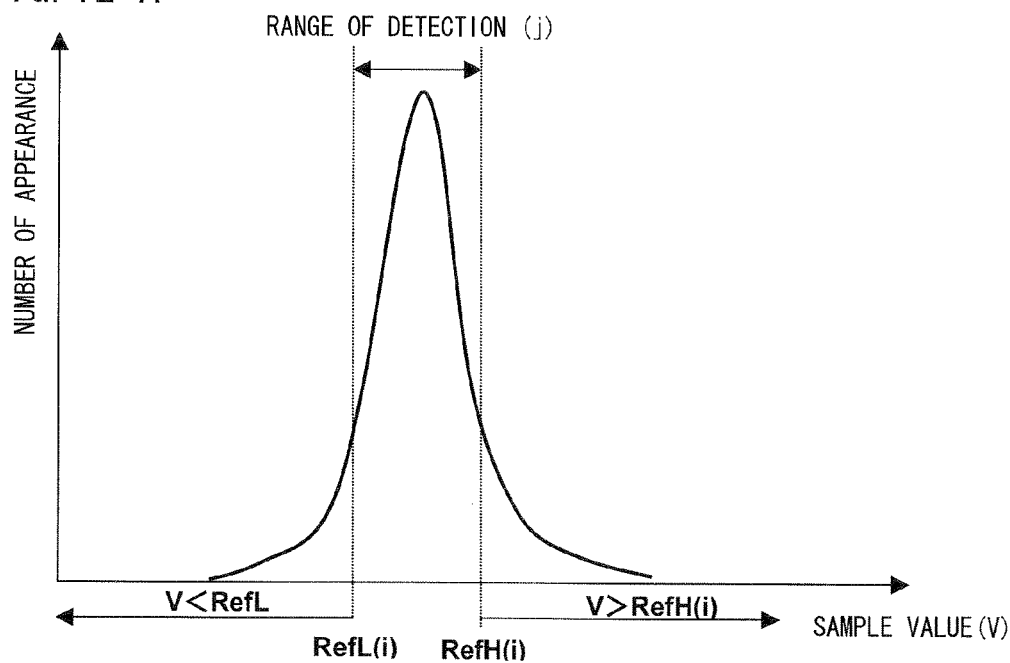
FIGS. 12A and 12B are diagrams describing the number counting operation.
Figure 12:
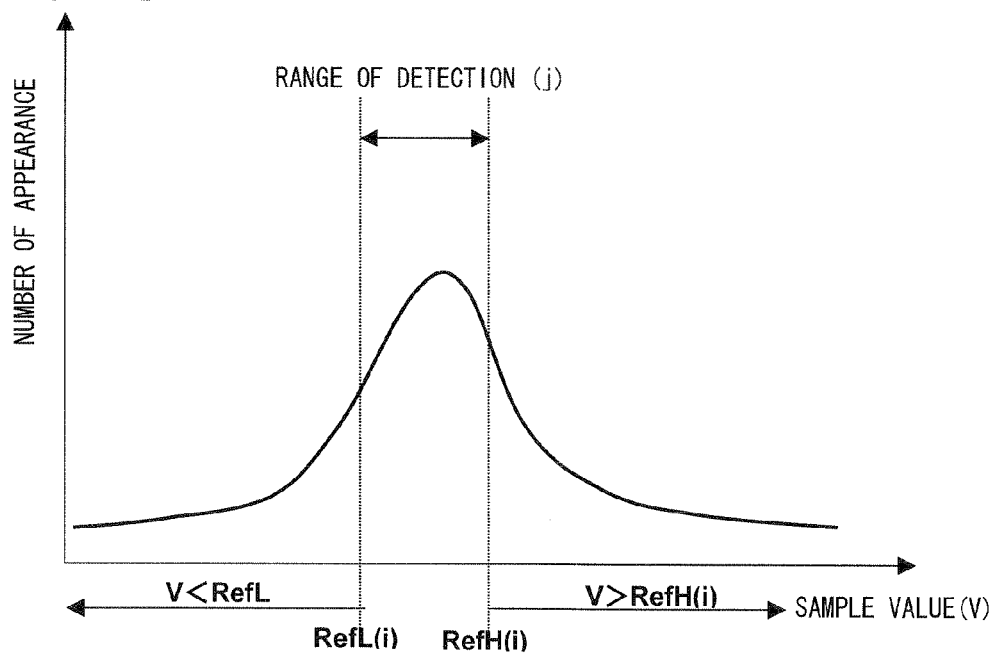

FIG. 11 illustrates a timing chart describing processing of counting the number. Further, FIGS. 12A and 12B illustrate diagrams describing processing of counting the number. Here, in an example illustrated in FIG. 10 and FIG. 11, each counting period in which a combination of the upper-limit reference voltage RefH and the lower-limit reference voltage RefL corresponding to the REF controlling code is set is divided into a front half and a rear half according to the switching signal. Note that each counting period T is discriminated by adding a subscript denoting a combination of number i corresponding to the EQ controlling code and number j corresponding to the REF controlling code. Further, in the example of FIG. 10 and FIG. 11, the selector 225 selects the upper-limit reference voltage RefH in the front half of each counting period $T_o$, and selects the lower-limit reference voltage RefL in the rear half thereof.

In the beginning of each counting period, first, the count value of the counter 222 is cleared in response to instruction from the timing controlling part 118. Further, the upper-limit reference voltage RefH is selected by the selector 225 in response to the switching signal, and is set as the reference voltage for the comparator 221 (step 321).

Thereafter, every time the sample value V is obtained by sampling in synchronization with the clock signal from the CDR circuit 104 (step 322), the comparator 221 compares this sample value V with the upper-limit reference voltage RefH (step 323).

Every time the comparator 221 detects the sample value V having a value higher than the upper-limit reference voltage RefH (affirmative judgment in step 323), a count value NumA of the counter 222 is incremented (step 324). Such counting operation is repeated until the reference voltage is switched by the switching signal. The count value NumA of the counter 222 obtained thus is, for example, the total sum of the number of appearances of a sample value having a value deviating to the upper side of the range of detection (j), which is located between dashed lines in FIG. 12A.

Thereafter, when the reference voltage is switched to the lower-limit reference voltage RefL by the switching signal (affirmative judgment in step 325), the count value NumA of the counter 222 is stored in the memory 223 (step 326). Next, the counter 222 is cleared (step 327).

Thereafter, every time the sample value V is obtained by sampling similar to step 322 (step 328), the comparator 221 compares this sample value V with the lower-limit reference voltage RefL (step 329).

Every time the comparator 221 detects the sample value V having a value lower than the lower-limit reference voltage RefL (affirmative judgment in step 329), a count value NumB of the counter 222 is incremented (step 330). Such counting operation is repeated until the end of the counting period corresponding to the range of detection set by the REF controlling code. The count value NumB of the counter 222 obtained thus is, for example, the total sum of the number of appearances of a sample value having a value deviating to the lower side of the range of detection (j), which is located between dashed lines in FIG. 12A.

Thereafter, in response to the end of the counting period corresponding to the range of detection set by the REF controlling code (affirmative judgment of step 331), the count value NumB of the counter 222 and the count number NumA stored in the memory 223 are added by the adder 224 (step 332).

In FIG. 11, the numbers illustrated corresponding to the front half and the rear half respectively of each counting period are examples of the count values NumA, NumB. Further, examples of addition results NumA+NumB of the count values NumA, NumB are illustrated corresponding to the rear halves of the respective counting periods. Each addition result of the count values NumA, NumB obtained in this manner is a total sum of numbers of appearances of sample values distributed outside of the range of detection (j) with boundaries illustrated by dashed line in FIGS. 12A and 12B. As is clear from comparison between FIGS. 12A and 12B, smallness of this total sum of numbers (NumA+NumB) indicates that there is a sharp peak in the range of detection. That is, the circuit structure in which the adder 224 obtains this total sum of numbers (NumA+NumB) is an example of an index calculating part calculating an index indirectly indicating the number of samples distributed within the range of detection. By searching for the EQ controlling code which causes the number of samples distributed to a range other than this range of detection to be small, alteration of the equalizer 103 can be performed.

Figure 13:
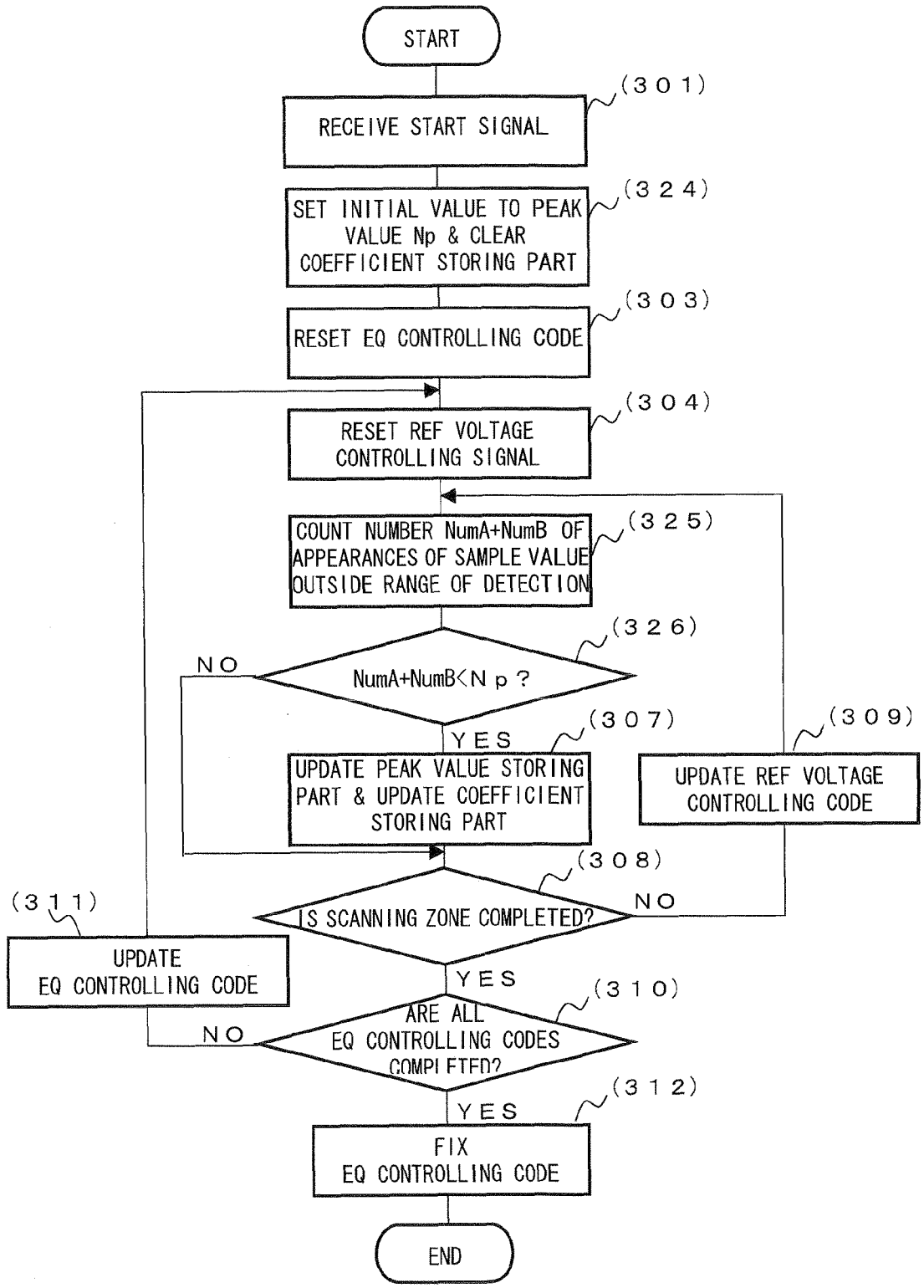
FIG. 13 is a flowchart representing optimum coefficient searching operation.

FIG. 13 illustrates a flowchart representing optimum coefficient searching operation. Note that among procedures illustrated in FIG. 13, procedures equivalent to those illustrated in FIG. 7 are denoted by the same symbols, and descriptions thereof are omitted.

In the example illustrated in FIG. 13, instead of clearing the peak value storing part 217, the timing controlling part 118 sets as an initial value the maximum value which can be counted by the counter 222, or the like in step 324. Further, instead of the number of appearances of a sample value within the range of detection set by the REF controlling code, the number counting part 113 counts the number NumA+NumB of appearances of a sample value outside the range of detection (step 325) following the procedure described using FIG. 10. In addition, in the example of FIG. 11, for each counting period corresponding to the REF controlling code, the value of the number NumA+NumB of appearances of a sample value outside the range of detection counted by the number counting part 113 is illustrated.

Further, in step 326, instead of the number N of appearances of a sample value within the range of detection, the above-described number NumA+NumB of appearances of a sample value outside the range of detection is compared with the peak value Np stored in the peak value storing part 217. When the number NumA+NumB of appearances of a sample value outside the range of detection is smaller than the peak value Np (affirmative judgment in step 326), the peak value storing part 217 and the coefficient storing part 219 are updated (step 307). In this manner, by the peak value storing part 217 and the comparator 218, it is possible to search for the minimum value of the number NumA+NumB of appearances of a sample value outside the range of detection.

In the example illustrated in FIG. 11, in the counting period $T_o$, corresponding to the combination of EQ controlling code [000] and REF controlling code [001], the peak value Np is updated with the number NumA+NumB of appearances.

Thereafter, in the counting period $T_{02}$ corresponding to the combination of EQ controlling code [000] and REF controlling code [010], the peak value Np is updated again. After this update, a state that the peak value Np is maintained without being updated continues for a while. Then, in the counting period $T_{12}$ corresponding to the combination of EQ controlling code [001] and REF controlling code [010] which are updated, update of the peak value Np occurs. At this time, as a new peak value Np, the number NumA+NumB of appearances obtained corresponding to the counting period 112 is stored in the peak value storing part 217. Further, in response to update of the peak value Np, the coefficient storing part 219 is also updated. By this update, the EQ controlling code [001] is stored in the coefficient storing part 219 instead of the EQ controlling code [000].

In this manner, it is possible to search for the EQ controlling code indicating the equalizer coefficient which causes the number of samples having a sample value which is out of the range of detection to be minimum.

When the number counting part 113 is structured as illustrated in FIG. 9, destinations of distribution of the output signal of the equalizer 103 and the clock signal generated in the CDR circuit 104 can be reduced to one comparator 221. Accordingly, it is possible to further reduce power consumption in the equalizer 103. Further, a wiring space and so on needed for distribution of signals can also be reduced.

(Still Another Embodiment)

Figure 14:
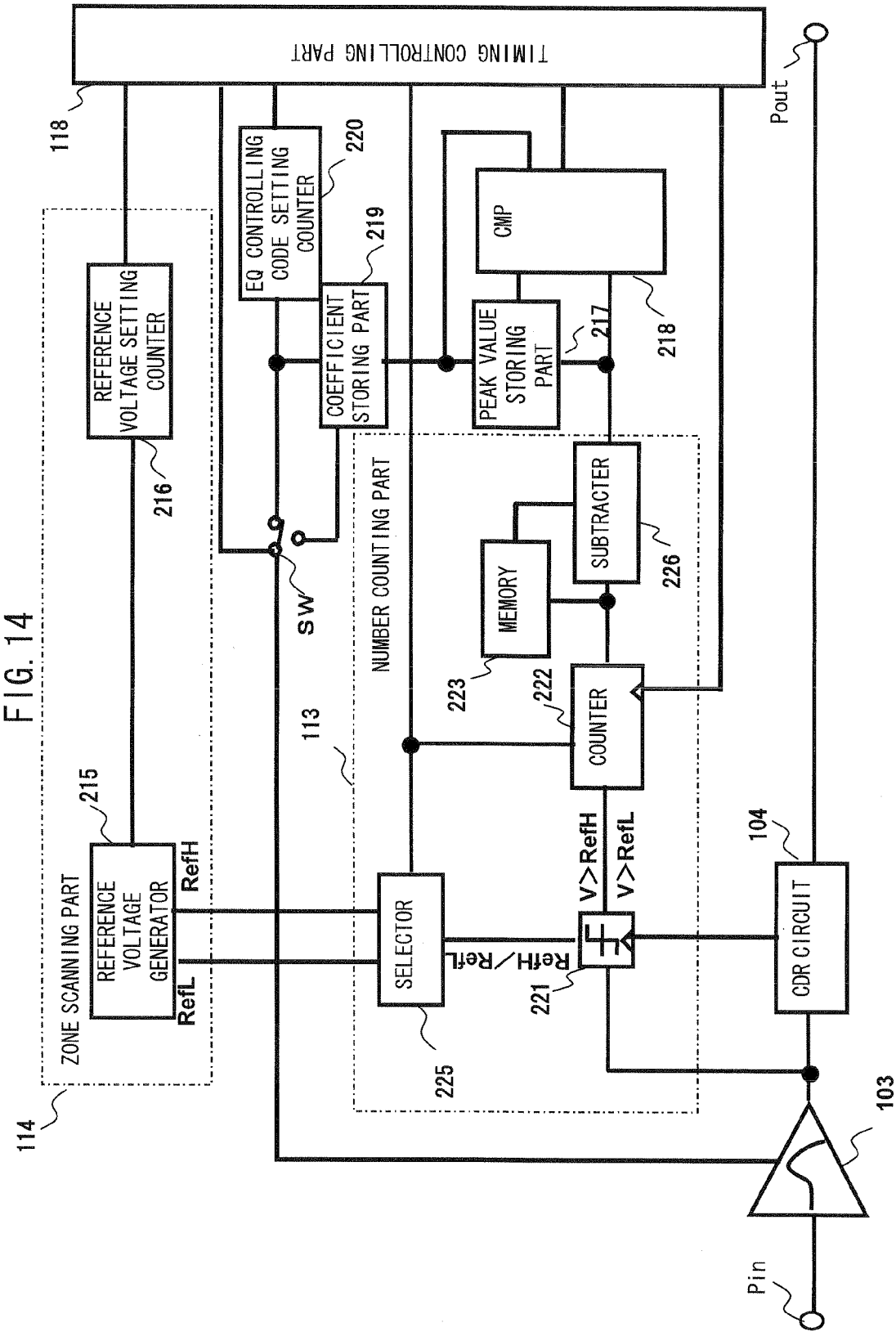
FIG. 14 is a diagram illustrating another embodiment of the number counting part.

FIG. 14 illustrates another embodiment of the number counting part. Note that among components illustrated in FIG. 14, components equivalent to those illustrated in FIG. 9 are denoted by the same symbols, and descriptions thereof are omitted.

The number counting part 113 illustrated in FIG. 14 includes a subtracter 226 instead of the adder 224 illustrated in FIG. 9. Further, the counter 222 illustrated in FIG. 14 counts the number of times the comparator 221 outputs an indication that the sample value V corresponding to the output of the equalizer 103 is larger than the reference voltage in both the front half and rear half of the above-described counting period. The count value NumA in the counter 222 in the front half of a counting period is stored in the memory 223 at the timing the upper-limit reference voltage RefH and the lower-limit reference voltage RefL are switched by the switching signal. Subsequently, in the rear half of the counting period, the number NumB of appearances of a sample value V larger than the lower-limit reference voltage RefL is counted. Then, at the timing the REF controlling code is switched, the subtracter 226 subtracts the count value NumA stored in the memory 223 from the count value NumB obtained by the counter 222 in counting processing in the rear half of the counting period.

In this manner, in the example of FIG. 14, for each of the upper limit and the lower limit of the range of detection, the comparator 221 discriminates a sampling result having a value larger than the reference voltage in a time division manner. Such a circuit structure is an example of a discriminating part which discriminates a sampling result.

Figure 15:
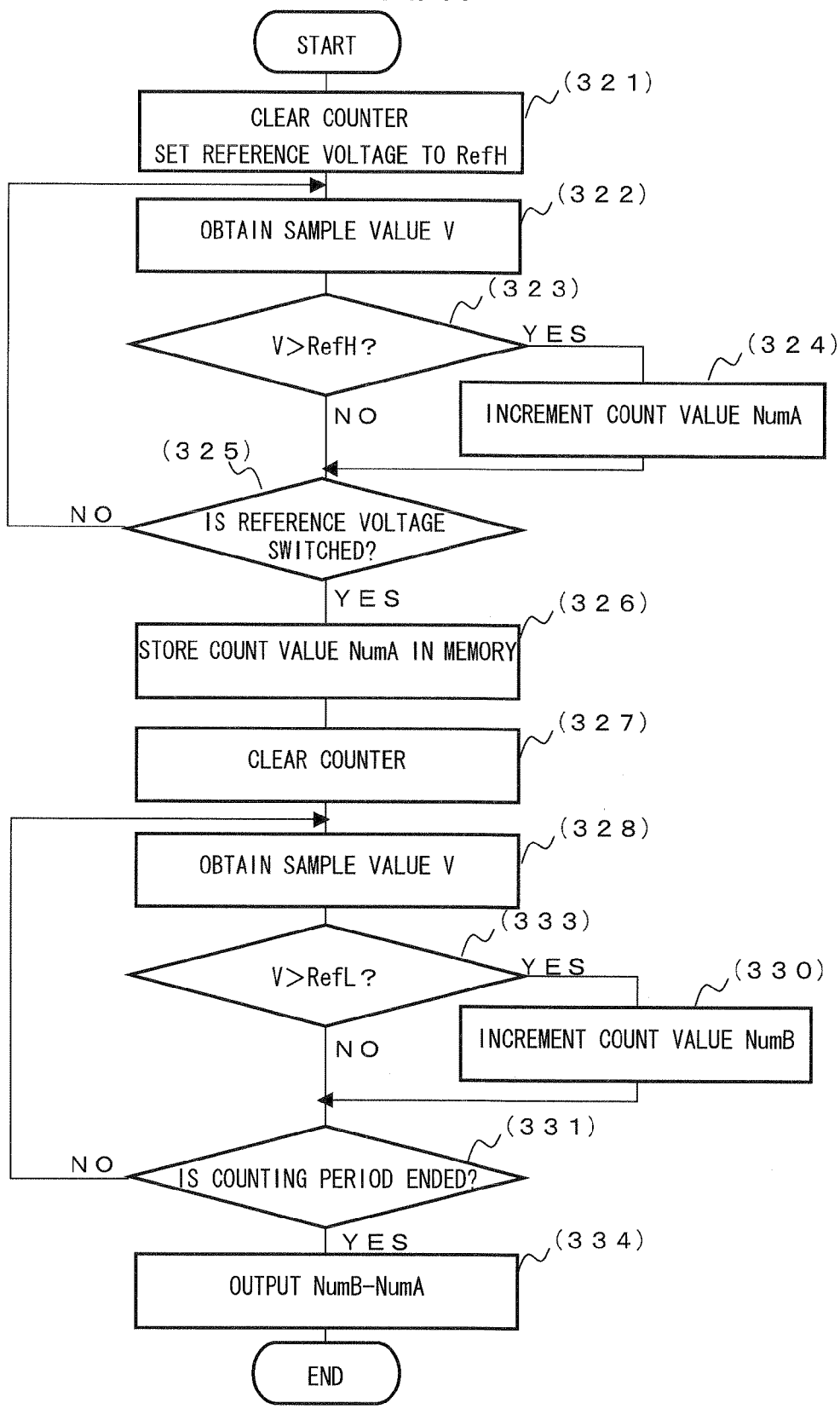
FIG. 15 is a flowchart representing operation of the number counting part.
Figure 16:
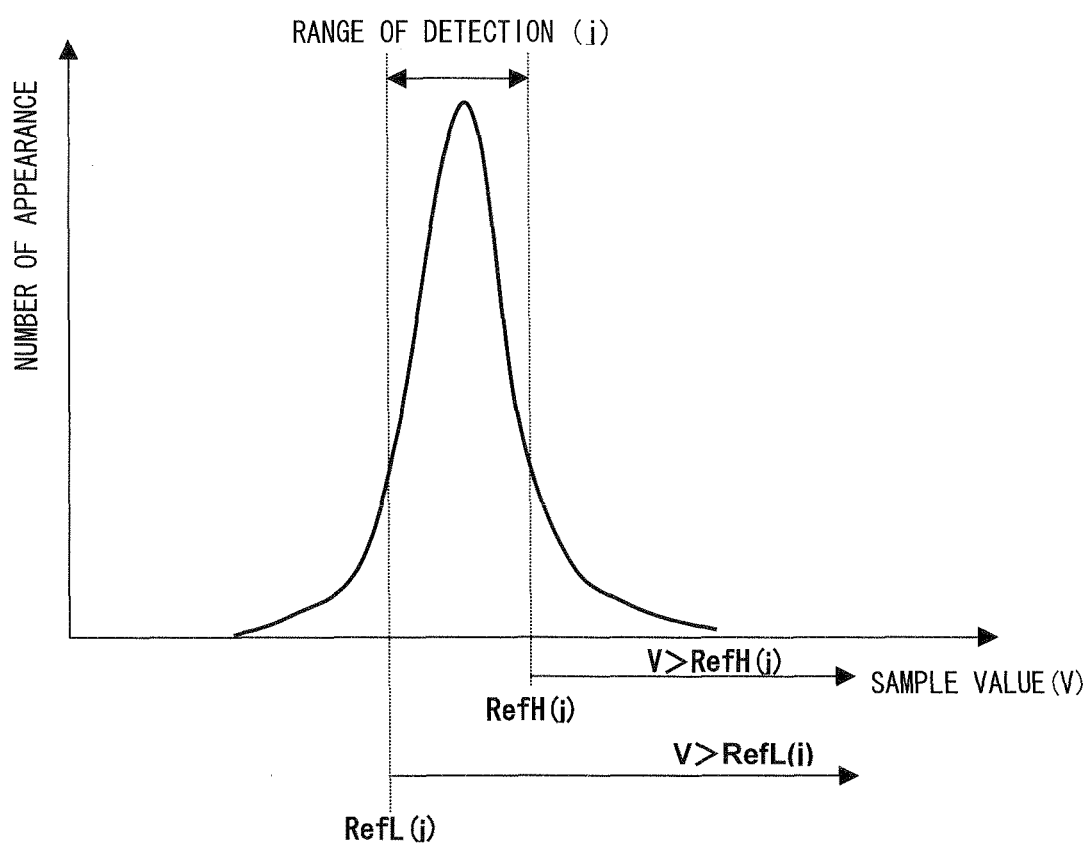
FIG. 16 is a diagram describing number counting operation.
Figure 17:
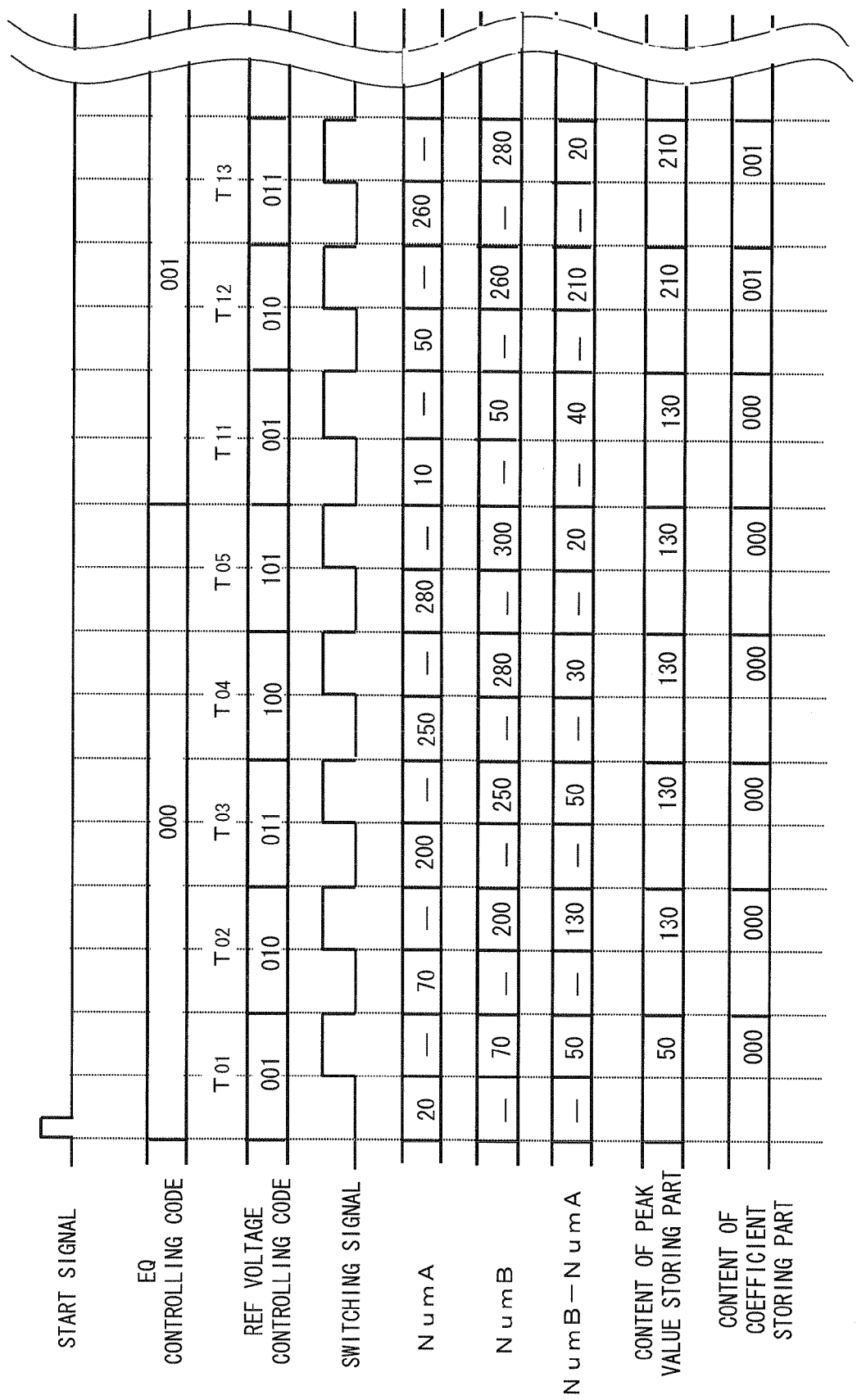
FIG. 17 is a timing chart describing coefficient searching operation.

FIG. 15 illustrates a flowchart representing operation of the number counting part. Further, FIG. 16 illustrates a diagram describing processing of counting the number. Moreover, FIG. 17 illustrates a timing chart describing operation of counting the number.

Note that among procedures illustrated in FIG. 15, procedures equivalent to those illustrated in FIG. 10 are denoted by the same symbols, and descriptions thereof are omitted. Likewise, among elements such as signals and counting periods illustrated in FIG. 17, elements equivalent to those illustrated in FIG. 11 are denoted by the same symbols, and descriptions thereof are omitted.

In the flowchart illustrated in FIG. 15, processing of the rear half of a counting period after the reference voltage is switched is different from the example illustrated in FIG. 10. One difference is that the count value NumB of the counter 222 is incremented (step 330) when the sample value V is higher than the lower-limit reference voltage RefL (affirmative judgment in step 333). Another difference is processing performed when the counting period ends (affirmative judgment in step 331). In the example of FIG. 15, the subtracter 226 subtracts the number NumA of samples having a value higher than the upper-limit reference voltage RefH from the number NumB of samples having a value higher than the lower-limit reference voltage RefL (step 334).

The number NumB of samples having a value higher than the lower-limit reference voltage RefL(j) of the range of detection (j) corresponds to the number of samples distributed to the right side of the left boundary of the range of detection (j) in FIG. 16. The number NumA of samples having a value higher than the upper-limit reference voltage RefH(j) of the range of detection (j) corresponds to the number of samples distributed to the right side of the right boundary of the range of detection (j) in FIG. 16. Therefore, by subtracting the number NumA of samples from the number NumB of samples, the number of samples distributed within the range of detection (j) can be obtained. That is, the above-described circuit structure in which the subtracter 226 subtracts the number NumA of samples from the number NumB of samples is an example of a number calculating part calculating the number of samples within the range of detection.

In this manner, the number counting part 113 illustrated in FIG. 14 can count the number of samples having a value within the range of detection set by the REF controlling code, similarly to the way performed by the number counting part 113 illustrated in FIG. 4. Based on the number NumB-NumA of samples within the range of detection obtained by the subtracter 224 illustrated in FIG. 14, it is possible to search for the EQ controlling code corresponding to the optimum EQ coefficient by processing similar to FIG. 7.

For example, in the example illustrated in FIG. 17, in the counting period $T_{01}$ corresponding to the combination of EQ controlling code [000] and REF controlling code [001], a numerical value "50" is obtained as the number NumB-NumA of samples within the range of detection. In the illustrated example, this value is stored as the peak value Np in the peak value storing part 217. Subsequently, in the counting period Toe corresponding to the combination of EQ controlling code [000] and REF controlling code [010], the peak value Np is updated with a value "130" of the number NumB-NumA of samples. In the example of FIG. 17, a state that the peak value Np is maintained without being updated continues for a while. Then, in the counting period $T_{12}$ corresponding to the combination of EQ controlling code [001] and REF controlling code [010] which are updated, the peak value Np is updated again with the number NumB-NumA of samples indicating the number of samples within the range of detection. In response to update of this peak value Np, the coefficient storing part 219 is updated. Instead of the EQ controlling code [000] retained first, the EQ controlling code [001] when update of the peak value Np occurred is stored.

By continuing such processing, it is possible to search for the EQ controlling code indicating the equalizer coefficient which causes the number of samples having a voltage value within the range of detection to be maximum.

In addition, when the number counting part 113 as illustrated in FIG. 14 is used, it is also possible to input only the reference voltage corresponding to the upper limit or the lower limit of the range of detection indicated by the REF controlling code to the number counting part 113 by the reference voltage generator 215. In this case, using the correspondence of the upper limit or lower limit of the range of detection which is set previously to the lower limit or upper limit of the range of detection which is set subsequently, it is possible to count the number of appearances of a sampling result having a sample value within the range of detection.

Next, an example of implementing the equalizer controlling circuit in the receiving device will be described. This equalizer controlling circuit searches for the EQ coefficient which causes the number of samples having a voltage value within the range of detection to be maximum, that is, the optimum EQ coefficient which causes the dispersion of sampling results to be minimum.

(Still Another Embodiment)

Figure 18:
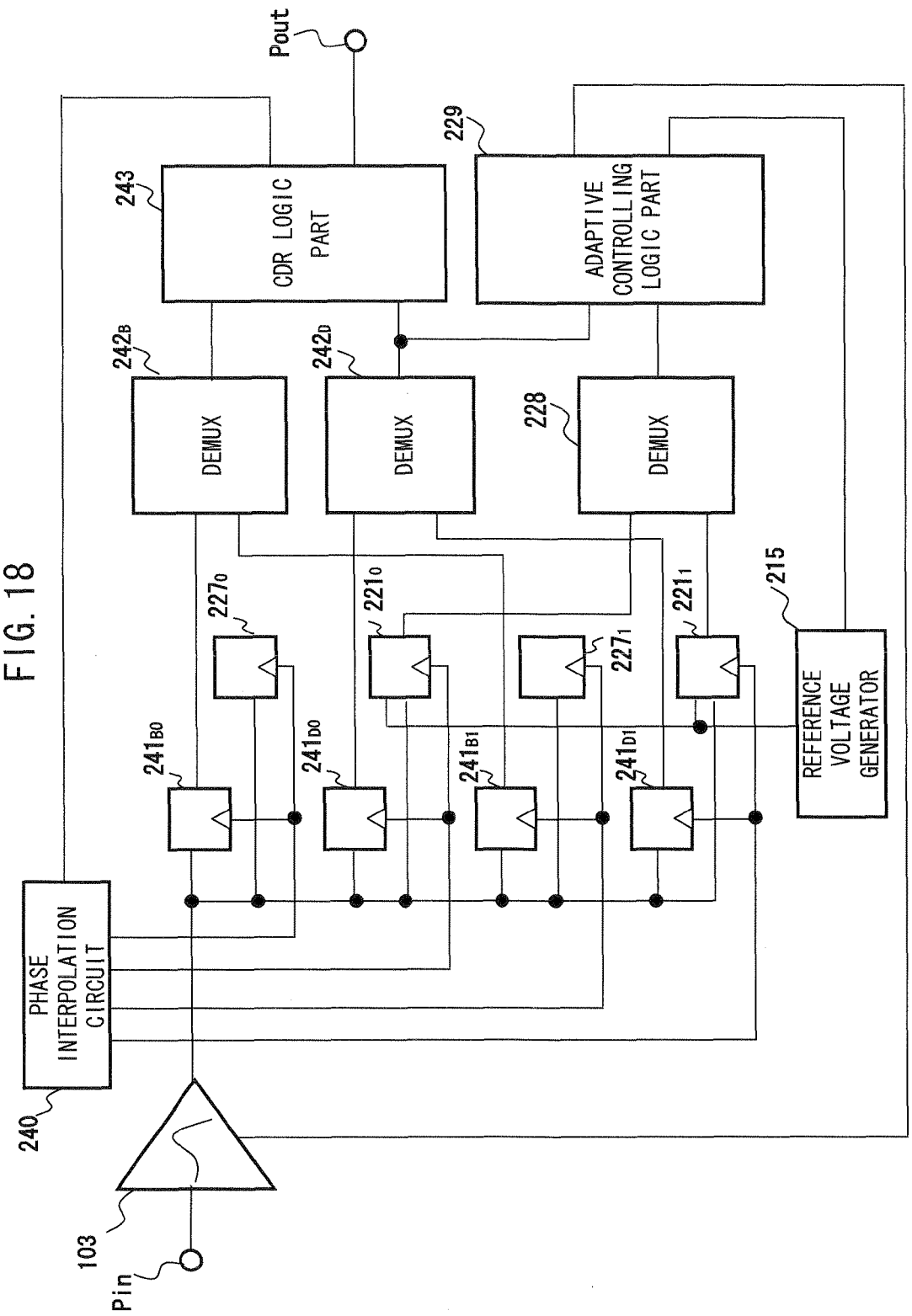
FIG. 18 is a diagram illustrating another embodiment of the receiving device.

FIG. 18 illustrates another embodiment of the receiving device. Note that among components illustrated in FIG. 18, components equivalent to those illustrated in FIG. 1 and FIG. 14 are denoted by the same symbols, and descriptions thereof are omitted. In the embodiment described below, to use a test signal used for training when the equalizer is altered, processing of searching for the optimum coefficient is performed while a test signal is input.

In the receiving device illustrated in FIG. 18, an input signal is input to the equalizer 103 via a port Pin. An output signal of the equalizer 103 is input to four comparators $241_{B0}$, $241_{D0}$, $241_{B1}$, $241_{D1}$, for CDR processing. Further, the output signal of the equalizer 103 is also input to two comparators $221_0$, $221_1$ for searching for the EQ coefficient and to dummy comparators $227_0$, $227_1$. Any of the comparators $241_{B0}$, $241_{D0}$, $241_{B1}$, $241_{D1}$, comparators $221_0$, $221_1$, and comparators $227_0$, $227_1$ can be achieved using a decision latch circuit element for example. In FIG. 18, the comparators $241_{B0}$, $241_{D0}$, $241_{B1}$, $241_{D1}$, comparators $221_0$, $221_1$, and comparators $227_0$, $227_1$ are denoted by using a symbol DL.

To the comparators $241_{B0}$, $241_{D0}$, $241_{B1}$, $241_{D1}$, clock signals with four phases are input, the phases being shifted 90 degrees each, which is a half frequency of a synchronizing signal of the input signal. Further, to the comparators $221_0$, $221_1$, clock signals with the same phases as those for the above-described comparators $241_{D0}$, $241_{D1}$ are input. To the comparators $227_0$, $227_1$, clock signals with the same phases as those for the above-described comparators $241_{B0}$, $241_{B1}$ are input. The clock signals with four phases described above are generated by a phase interpolation circuit 240 based on a clock signal recovered by a CDR logic part 243. In addition, the dummy comparators $227_0$, $227_1$ are disposed for equalizing loads on circuits generating the clock signals with four phases in the phase interpolation circuit 240. Moreover, in the decision latch, sampling in synchronization with a clock signal and comparison with a reference voltage are performed simultaneously. A result of this comparison becomes an output of a comparator including the decision latch.

Reference voltage for the comparators $241_{D0}$, $241_{D1}$ are fixed to a threshold for 0/1 determination. Outputs of the comparators $2410_{D0}$, $241_{D1}$ are parallelized by a demultiplexer (DEMUX) $242_D$. For example, this demultiplexer $242_D$ generates 8-bit received data by parallelizing outputs of the two comparators $241_{D0}$, $241_{D1}$. The generated received data are subjected to CDR processing in the CDR logic part 243.

Likewise, reference voltage for the comparators $241_{B0}$, $241_{B1}$ are fixed to the threshold for 0/1 determination. From outputs of the comparators $241_{B0}$, $241_{B1}$, a demultiplexer (DEMUX) $242_B$ generates, for example, 8-bit boundary data. The generated boundary data are subjected to CDR processing in the CDR logic part 243.

The CDR logic part 243 performs recovery processing of a clock signal based on the received data and the boundary data. Further, in the CDR logic part 243, the received data may be further parallelized corresponding to the processing rate of another device disposed in the subsequent stage of the receiving device. The received data or the further parallelized received data are passed to the device in the subsequent stage via an output port Pout.

The two comparators $221_0$, $221_1$ for searching for the EQ coefficient illustrated in FIG. 18 compare the reference voltage generated by the reference voltage generator 215 with an output of the equalizer 103 in synchronization with the above-described clock signal. From outputs of these comparators $221_0$, $221_1$, the demultiplexer (DEMUX) 228 generates, for example, 8-bit comparing data. The generated comparing data are subjected to search processing for the optimum EQ coefficient by an adaptive controlling logic part 229.

The adaptive controlling logic part 229 includes the peak detecting part 115, the coefficient specifying part 117, and the timing controlling part 118 illustrated in FIG. 1. Further, among the number counting part 113, the zone scanning part 114, and the coefficient altering part 116, a portion which may be achieved by a logic device is included in the adaptive controlling logic part 229.

For each range of detection, the adaptive controlling logic part 229 performs processing of counting the number of appearances of an output voltage value of the equalizer 103 included in this range of detection. This counting processing is performed based on the above-described 8-bit comparing data. Further, to perform the above-described counting processing for each range of detection, the adaptive controlling logic part 229 performs control to vary the reference voltage generated by the reference voltage generator 215 and the equalizer coefficient. Thus, the adaptive controlling logic part 229 searches for the equalizer coefficient which causes dispersion in the appearance number distribution with respect to the output voltage value of the equalizer 103 to be minimum.

In addition, in the example illustrated in FIG. 18, the received data generated by the demultiplexer 242D are also used in the adaptive controlling logic part 229. Accordingly, as will be described later, the circuit scales of the adaptive controlling logic part 229 and the reference voltage generator 215 are reduced.

In the example of FIG. 18, the adaptive controlling logic part 229 performs selective counting processing for comparing data obtained at sampling timing when the received data is "1". Thus, the range of variation of the reference voltage generated by the reference voltage generator 215 can be limited to the range which is equal to a half of the range of variation of the output voltage of the equalizer 103. In this case, for example, a resistor ladder generating the reference voltage in the range of 0 V to 0.5 V which is equal to a half of the range of variation of the output voltage of the equalizer 103 can be used to achieve the reference voltage generator 215. Here, it is needless to mention that similar selective counting processing may be performed for the comparing data obtained at sampling timing when the received data is "0".

The example illustrated in FIG. 18 is an implementation example in which the CDR processing and the processing of searching for the optimum coefficient in the disclosure of the present application are started and performed simultaneously in the receiving device.

The processing of searching for the optimum coefficient disclosed in the present application need not necessarily be implemented to start simultaneously with the CDR processing. For example, in another possible implementation, the CDR processing is performed in advance in the receiving device, and a result of this CDR processing is used to perform the processing of searching for the optimum coefficient of the disclosure of the present application.

Hereinafter, an implementation example of the receiving device structured to perform the CDR processing in advance of search processing for the optimum coefficient of the disclosure of the present application will be described.

(Still Another Embodiment)

Figure 19:
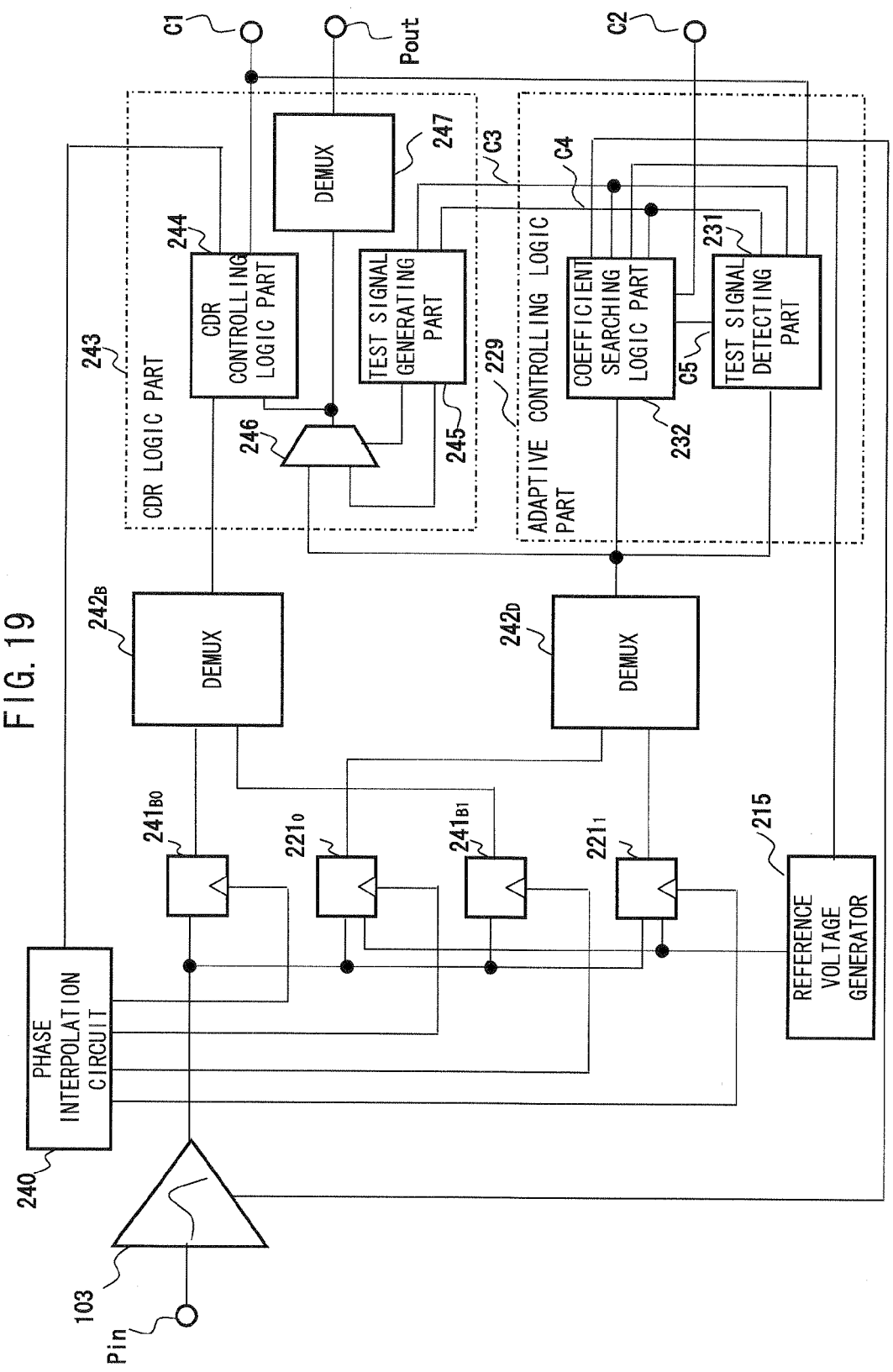
FIG. 19 is a diagram illustrating another embodiment of the receiving device.

FIG. 19 illustrates another embodiment of the receiving device. Note that among components illustrated in FIG. 19, components equivalent to those illustrated in FIG. 18 are denoted by the same symbols, and descriptions thereof are omitted.

The receiving device illustrated in FIG. 19 includes two comparators $221_0$, $221_1$ for obtaining received data and two comparators $241_{B0}$, $241_{B1}$ for obtaining boundary data. To these comparators $241_{B0}$, $221_0$, $241_{B1}$, $221_1$, clock signals with four phases differing by 90 degrees each are input. These clock signals with four phases are generated by the phase interpolation circuit 240 similarly to the example illustrated in FIG. 18.

Outputs of the comparators $241_{B0}$, $241_{B1}$ are parallelized by a demultiplexer $242_B$. Further, outputs of the comparators $221_0$, $221_1$ are parallelized by a demultiplexer $242_D$. The demultiplexers $242_B$, $242_D$ parallelize outputs of the comparators $241_{B0}$, $241_{B1}$ and outputs of the comparators $221_0$, $221_1$ respectively in, for example, each period of four cycles. By parallelization processing of these outputs, 8-bit received data and boundary data are obtained.

To the CDR logic part 243, both the received data and the boundary data described above are input. On the other hand, to the adaptive controlling logic part 229, only the received data obtained in the multiplexer $242_D$ are input.

The adaptive controlling logic part 229 illustrated in FIG. 19 has a test signal detecting part 231 and a coefficient searching logic part 232. An output of the demultiplexer $242_D$ is input to the test signal detecting part 231 and the coefficient searching logic part 232.

The test signal detecting part 231 verifies the input received data with the test signal every time training of the receiving device starts and every time the equalizer coefficient is updated by the coefficient searching logic part 232. When the test signal is detected from the received data, the test signal detecting part 231 causes the coefficient searching logic part 232 to start number counting processing with respect to the equalizer coefficient being set. On the other hand, when the test signal is not detected from the received data, the test signal detecting part 231 instructs the coefficient searching logic part 232 to update the equalizer coefficient. In the example of the receiving device illustrated in FIG. 19, a detection result of the test signal by the test signal detecting part 231 is notified to the coefficient searching logic part 232. Then, update of the equalizer coefficient by the coefficient searching logic part 232 is controlled in response to this notification. The circuit structure in which the test signal detecting part 231 and the coefficient searching logic part 232 cooperate in this manner is an example of an alteration controlling part controlling alteration of the equalizer coefficient based on a result of comparing the test signal with the received data.

Here, a CDR-en signal indicating start of CDR processing is input to the test signal detecting part 231 and the CDR logic part 243 via a terminal C1 illustrated in FIG. 19. Further, an ADEQ-en signal indicating start of adaptive equalization processing is input to the coefficient searching logic part 232 via a terminal C2 illustrated in FIG. 19. On the other hand, the path denoted by symbol C3 in FIG. 19 is used for transmitting a notification indicating whether detection of test signal by the test signal detecting part 231 is succeeded or not. Further, the path denoted by symbol C4 in FIG. 19 is used for transmitting a notification indicating that a new equalizer coefficient is set by the coefficient searching logic part 232.

The CDR logic part 243 illustrated in FIG. 19 has a test signal generating part 245 and a selector 246, in addition to a CDR controlling logic part 244 performing normal CDR control processing. To the CDR controlling logic part 244, an output of the demultiplexer $242_B$ and an output of the selector 246 are input.

Upon reception of the notification indicating that the detection of test signal is succeeded from the test signal detecting part 231, the test signal generating part 245 generates a test signal used for training of the receiving device. This test signal generated in the test signal generating part 245 is input to the selector 246 together with received data from the demultiplexer $242_D$.

The selector 246 outputs received data from the demultiplexer $242_D$ or test data from the test signal generating part 245 in response to a switching signal. In the example illustrated in FIG. 19, this switching signal is generated by the test signal generating part 245 based on notifications input via the above-described paths C3, C4.

An output of the selector 246 is input to the CDR controlling logic part 244 and the demultiplexer (DEMUX) 247. This demultiplexer 247 performs processing of parallelizing received data corresponding to an operating clock of another device arranged in the subsequent stage of the receiving device. An output of the demultiplexer 247 is passed to the device in the subsequent stage via the output port Pout.

Here, in a training period of the receiving device, a test signal for altering the equalizer arrives at the receiving device repeatedly from an opposing transmission device. Therefore, after the test signal is detected from a received signal by the above-described test signal detecting part 231, received data represented by the received signal corresponding to an output of the equalizer 103 and the test signal are equal unless the equalizer coefficient changes. That is, in the period after the test signal is detected, the CDR controlling logic part 244 is able to execute CDR processing using the test signal generated in the test signal generating part 245, instead of the output of the demultiplexer $242_D$.

Accordingly, it is possible to share the comparators $221_0$, $221_1$ operating at data sampling timing between CDR processing and coefficient search processing. Sharing of the comparators $221_0$, $221_1$ can be achieved by switching the reference voltage in conjunction with switching of the selector 246 in a CDR processing phase prior to optimum coefficient searching and in an optimum coefficient searching phase started in response to success in detection of test signal. For example, in the CDR processing phase, the reference voltage corresponding to the threshold for 0/1 determination in these comparators $221_0$, $221_1$ may be set, and in the optimum coefficient searching phase, the reference voltage indicating the range of detection to be scanned may be set.

As described above, in the implementation example illustrated in FIG. 19, by achieving sharing of the comparators $221_0$, $221_1$, the scale of analog circuits is reduced as compared to the example illustrated in FIG. 18. Specifically, as compared to the example illustrated in FIG. 18, four decision latches and one demultiplexer can be deleted in the example of FIG. 19. Among various circuit elements included in the receiving device illustrated in FIG. 18, these analog circuits are elements occupying a relatively large area when being mounted in an LSI chip. Therefore, deletion of these analog circuits contributes to reduction of the implementation area of the receiving device.

Figure 20:
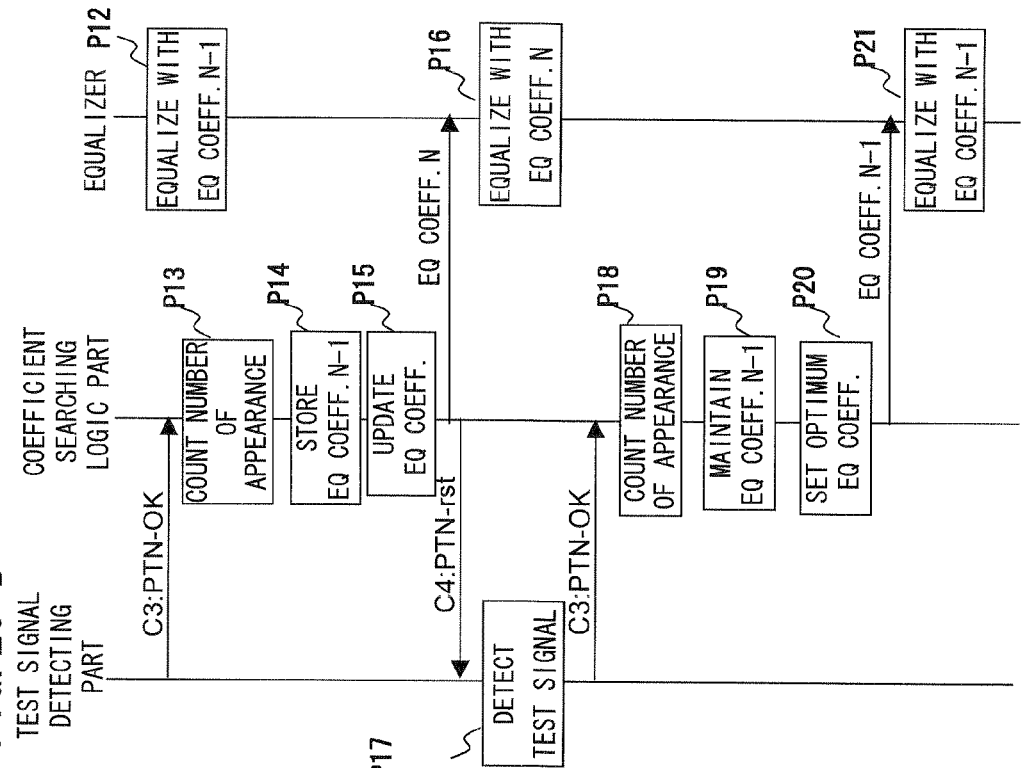
FIGS. 20 are sequence diagrams describing adaptive equalization operation.
Figure 20:
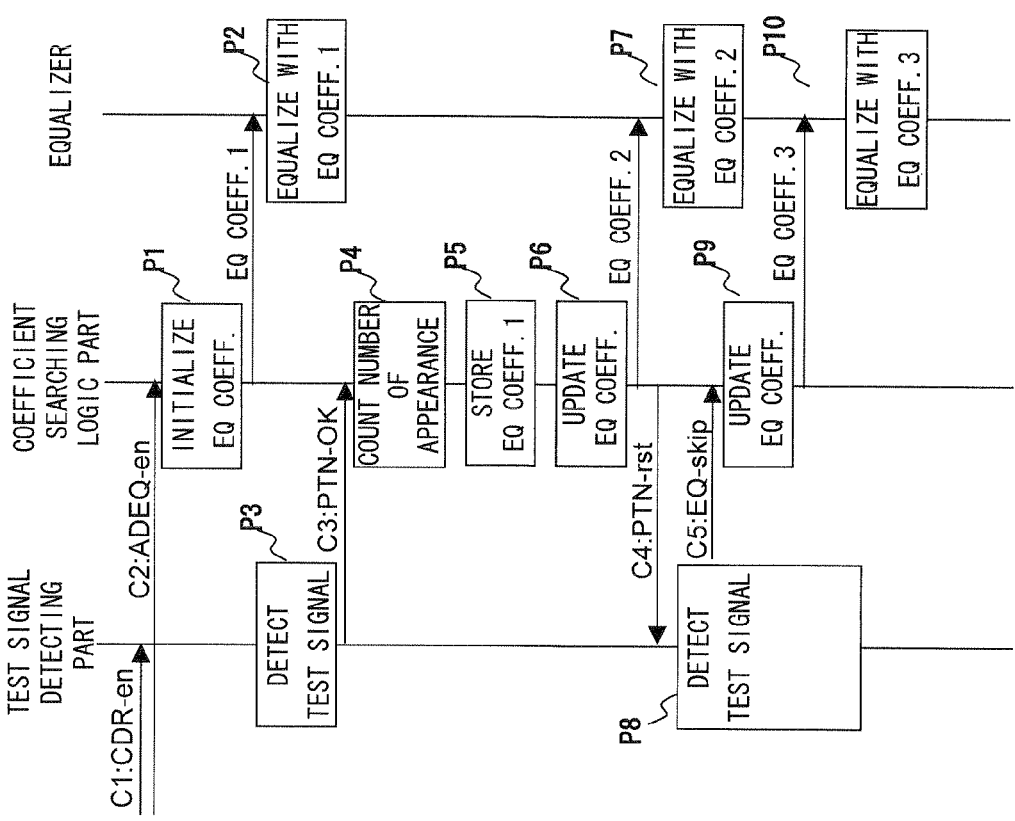

FIGS. 20 illustrate sequence diagrams describing adaptive equalization operation which is applied in the implementation example illustrated in FIG. 19. FIGS. 20 illustrate transmitting and receiving of signals among the test signal detecting part 231, the coefficient searching logic part 232, and the equalizer 103.

Figure 21:
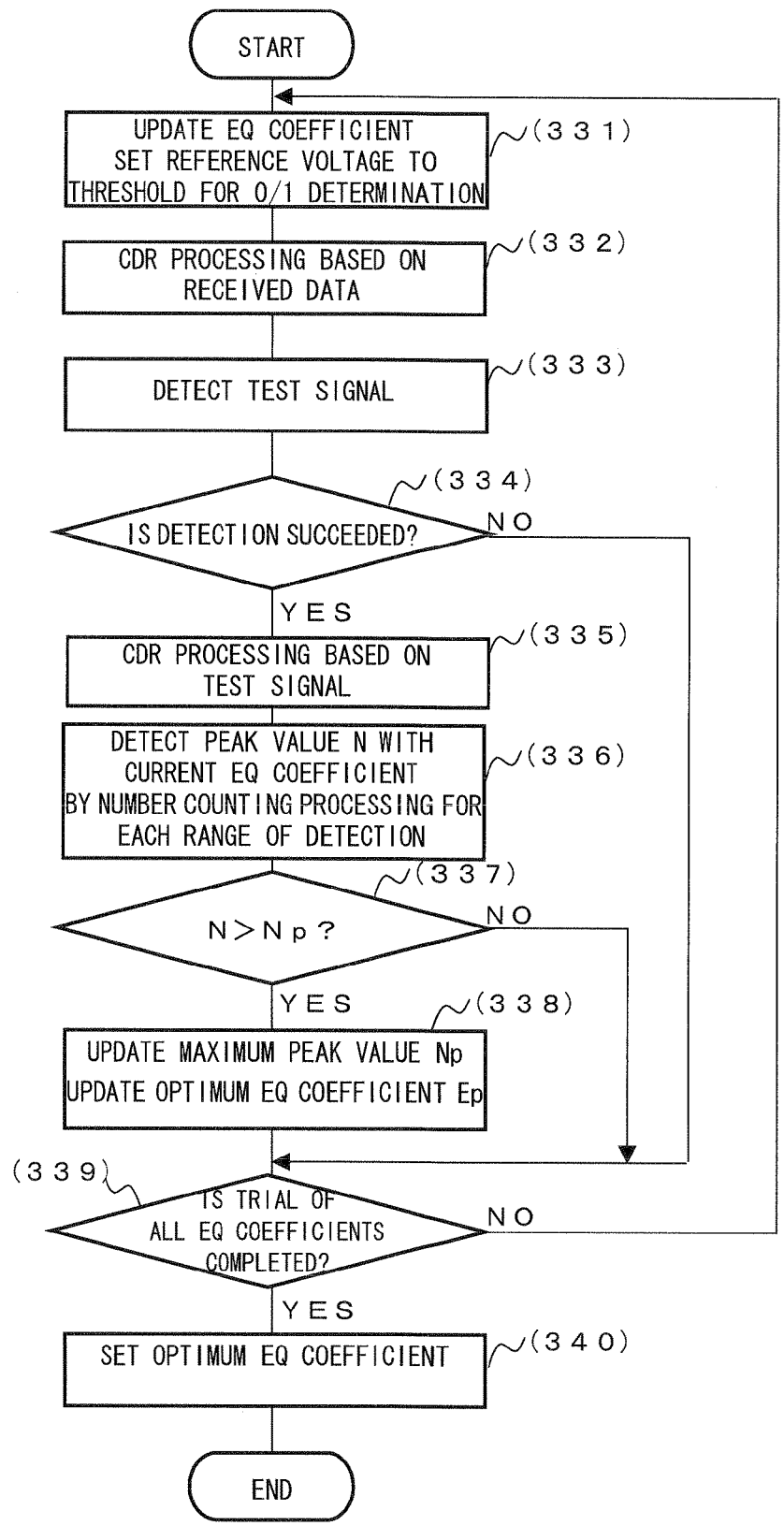
FIG. 21 is a flowchart representing adaptive equalization operation.

Further, FIG. 21 illustrates a flowchart representing the adaptive equalization operation which is applied in the implementation example illustrated in FIG. 19. In the example illustrated in FIG. 21, step 331 to step 334 correspond to the CDR processing phase, and step 335 to step 339 correspond to the optimum coefficient searching phase.

In the example illustrated in FIG. 20(A), in response to input of the CDR-en signal and the ADEQ-en signal described above, first, the coefficient searching logic part 232 initializes the equalizer (EQ) coefficient (P1). By this initialization processing, the EQ coefficient 1 corresponding to an EQ coefficient number 1 is set to the equalizer 103 as the first EQ coefficient. Then, the equalizer 103 received this setting performs equalization processing applying the EQ coefficient 1 (P2).

In the flowchart illustrated in FIG. 21, processing P1 illustrated in the sequence diagram corresponds to processing of step 331 in which the coefficient searching logic part 232 sets the new equalizer (EQ) coefficient to the equalizer 103. For example, every time this step 331 is executed, the coefficient searching logic part 232 may increment the EQ coefficient number from the initial value sequentially. Further, at this time, the coefficient searching logic part 232 sets the reference voltage of the above-described comparators $221_0$, $221_1$ to the threshold for 0/1 determination. Moreover, in the CDR controlling logic part 244, received data from the demultiplexer 242D are input via the selector 246.

In step 332 illustrated in FIG. 21, based on the received data and boundary data from the demultiplexer 242B, CDR processing by the CDR controlling logic part 244 is performed (step 332). Further, the test signal detecting part 231 performs processing of detecting a test signal from the received data (step 333).

In the example of sequence illustrated in FIG. 20(A), detection of test signal is succeeded in test signal detection processing (P3) in a state that the EQ coefficient 1 is set to the equalizer 103. Then, a PTN-OK signal indicating that the detection of test signal is succeeded is notified to the coefficient searching logic part 232.

When detection in the test signal detecting part 231 is succeeded thus (affirmative judgment in step 334 of FIG. 21), the CDR processing phase is finished. Then, the optimum coefficient searching phase is started. In the optimum coefficient searching phase, the CDR controlling logic part 244 executes CDR processing based on a test signal input via the selector 246 (step 335). At this time, further, the coefficient searching logic part 232 detects a peak value N of number distribution corresponding to the current EQ coefficient set to the equalizer 103 by performing number counting processing for each range of detection while controlling the reference voltage (step 336).

When the detected peak value N is larger than the maximum peak value Np which has been detected by that time (affirmative judgment in step 337), the maximum peak value Np and an optimum EQ coefficient Ep are updated (step 338).

In this step 338, the peak value N detected in step 336 is stored as a new peak value Np. Further, along with this processing, the current EQ coefficient is stored as the optimum EQ coefficient Ep. Here, an initial value 0 is set to the maximum peak value Np when the adaptive equalization operation is started. Therefore, for example, in the sequence diagram illustrated in FIG. 20(A), step 337 always results in affirmative judgment for the first peak value N obtained in number counting processing (P4) by the coefficient searching logic part 232. Then, this first peak value N is stored as a new maximum peak value Np. Along with this, update processing (P5) of storing the coefficient number 1 as the optimum EQ coefficient Ep is performed. On the other hand, when step 337 illustrated in FIG. 21 results in negative judgment, step 338 is skipped, and the maximum peak value Np and the optimum EQ coefficient Ep are maintained.

Thereafter, in the flowchart of FIG. 21, it is judged whether counting of number distribution for all EQ coefficients is tried or not (step 339). When still there is an EQ coefficient that is not tried, step 339 results in negative judgment, and processing returns to step 331 to set a new EQ coefficient. Then, again, the CDR processing phase is started. In the example illustrated in FIG. 20(A), after update processing (P5) of the optimum EQ coefficient, update processing (P6) of the EQ coefficient is performed. Then, the equalizer 103 which received setting of a new EQ coefficient 2 performs equalization processing (P7) applying this EQ coefficient 2. Further, after update processing (P6) of the EQ coefficient is completed, a PTN-rst signal indicating that the EQ coefficient is updated is notified to the test signal detecting part 231 from the coefficient searching logic part 232. In response to notification of this PTN-rst signal, the test signal detecting part 231 performs detection processing (P8) of test signal again.

Every time the equalizer coefficient of the equalizer 103 is updated in this manner, the CDR processing phase is implemented in advance, and after recovery of the clock signal is completed, the optimum coefficient searching phase can be implemented. Accordingly, it is clearly described that the receiving device which shares the decision latches used as the comparators $221_0$, $221_1$ between the CDR processing and the optimum coefficient searching can be achieved.

Further, in the example of the flowchart illustrated in FIG. 21, when it is judged in step 334 that the detection of test signal is unsuccessful (negative judgment), counting processing in step 335 to step 338 is skipped. Then, in response to judgment in step 339, update of the equalizer coefficient is performed.

Such process corresponds to a sequence as follows in the sequence example of FIG. 20(A). In the sequence example of FIG. 20(A), in middle of test signal detection processing denoted by symbol P8, an EQ-SKIP signal indicating that the detection of test signal is failed is passed from the test signal detecting part 231 to the coefficient searching logic part 232. Then, upon reception of this EQ-SKIP signal, the coefficient searching logic part 232 performs update processing of the EQ coefficient (P9). Next, equalization processing (P10) applying an EQ coefficient 3 which is newly set in update processing of this EQ coefficient is performed by the equalizer 103. On the other hand, in the test signal detecting part 231, the test signal detection processing (P8) is continued. Therefore, after the EQ coefficient 3 is set to the equalizer 103 in update processing of the EQ coefficient denoted by symbol P9, the test signal detecting part 231 performs the detection of test signal based on an output of the equalizer 103 to which the new EQ coefficient 3 is applied.

Thus, when the detection of test signal is failed, operation to update the equalizer coefficient is performed while continuing the detection of test signal.

Here, while training of the receiving device is performed, the test signal is repeatedly sent from the opposing transmitting device. Therefore, the situation that the detection of test signal is unsuccessful is limited to when equalization processing by the equalizer 103 is obviously inappropriate. Thus, the current equalizer coefficient set to the equalizer 103 this time obviously has low adaptability. Accordingly, by performing the above-described control, wasteful processing on the equalizer coefficient obviously having low adaptability can be omitted. Thus, the time required for the entire adaptive equalization processing can be reduced. Note that the above-described control of skipping counting processing for the equalizer coefficient obviously having low adaptability may also be applied to, for example, a receiving device having the structure illustrated in FIG. 18.

By repeating step 331 to step 339 described above, the number distribution of sampling results can be checked for all the equalizer coefficients excluding the equalizer coefficient obviously having low adaptability. When step 339 results in affirmative judgment, the equalizer coefficient stored as the optimum EQ coefficient is set to the equalizer 103 in step 340.

The example illustrated in FIG. 20(B) illustrates a situation that the peak value N obtained in number counting processing (P13) by the coefficient searching logic part 232 while equalization processing (P12) applying the EQ coefficient N-1 is performed is largest among all peak values. In this case, the peak value stored corresponding to the EQ coefficient N-1 is larger than the peak value obtained in processing for the last EQ coefficient N denoted by symbols P15 to P18. Therefore, as the optimum EQ coefficient, the EQ coefficient N-1 stored in processing denoted by symbol P14 is maintained (P19). This EQ coefficient N-1 is then set to the equalizer 103 as the final optimum EQ coefficient (P20). After adaptive equalization processing is completed thus, the equalizer 103 performs equalization processing applying the EQ coefficient N-1 (P21).

The adaptive equalization processing of the receiving device illustrated in FIG. 19 is completed thus. Thereafter, the equalizer 103 operates with the equalizer coefficient set in above-described step 340. Further, the reference voltage for the comparators $221_0$, $221_1$ is fixed to the threshold for 0/1 determination.

Next, an embodiment of respective parts included in the embodiment of the receiving device illustrated in FIG. 19 will be described. Any of the test signal generating part 245 included in the CDR logic part 243 and the test signal detecting part 231 and the coefficient searching logic part 232 included in the adaptive controlling logic part 229 can be achieved using a simple logical element.

Figure 22:
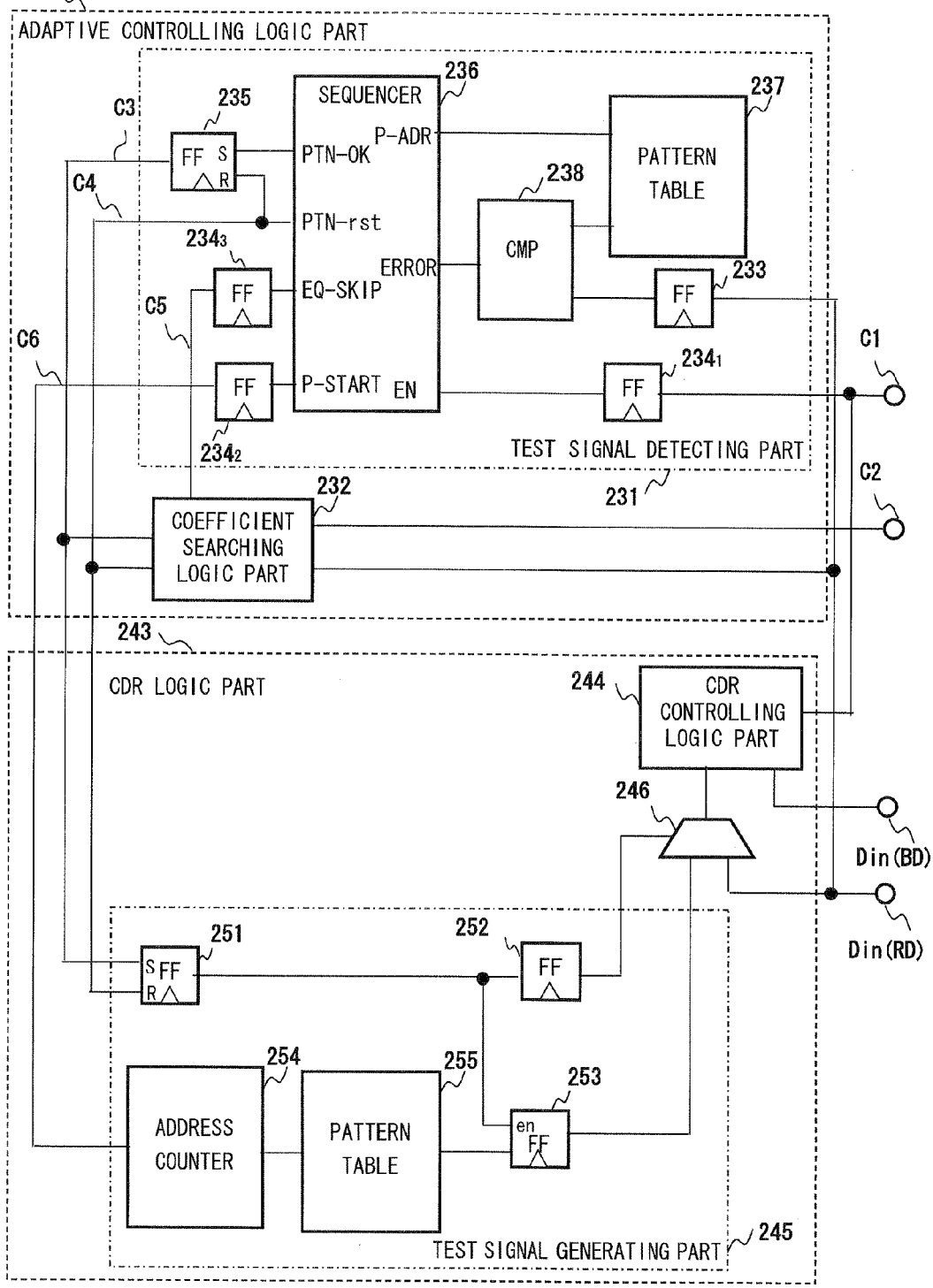
FIG. 22 is a diagram illustrating one embodiment of a test signal detecting part and a test signal generating part.

FIG. 22 illustrates one embodiment of the test signal detecting part and the test signal generating part. Note that among components illustrated in FIG. 22, components equivalent to those illustrated in FIG. 19 are denoted by the same symbols, and descriptions thereof are omitted.

The test signal detecting part 231 illustrated in FIG. 22 includes 8-bit flip flop (FF) 233, three flip flops (FF) $234_1$ to $234_3$, a set-reset flip flop (SR-FF) 235, and a sequencer 236. Note that illustration of clock signals to be input to the FF 233, FF $234_1$ to $234_3$, and SR-FF 235 is omitted in FIG. 22. The test signal detecting part 231 further includes a pattern table 237 and a comparing circuit (CMP) 238. In addition, in the pattern table 237, plural data patterns included in a test signal having a predetermined length are stored.

Further, the test signal generating part 245 illustrated in FIG. 22 includes a SR-FF 251, a FF 252, a FF 253 having an enable terminal en, an address counter 254, and a pattern table 255. Note that illustration of clock signals to be input to the SR-FE 251, FF 252, and FF 253 is omitted in FIG. 22. In addition, in the pattern table 255, plural data patterns included in the above-described test signal are stored.

A CDR-en signal which enables CDR operation is input to the CDR controlling logic part 244 and the test signal detecting part 231 via a terminal C1 illustrated in FIG. 22. In the test signal detecting part 231, this CDR-en signal is input to a control input terminal EN of the sequencer 236 via the FF $234_1$. Further, an ADEQ-en signal which enables adaptive control of the equalizer is input to the coefficient searching logic part 232 via a terminal C2.

Further, boundary data BD output from the DEMUX 242B illustrated in FIG. 19 are input to the CDR controlling logic part 244 via a data input port Din(BD) illustrate in FIG. 22. To a data input port Din(RD), received data RD output from the DEMUX $242_D$ illustrated in FIG. 19 are input. The received data RD are input to the test signal detecting part 231, the coefficient searching logic part 232, and the CDR logic part 243. In the CDR logic part 243 illustrated in FIG. 22, the received data RD is input to the CDR controlling logic part 244 via the selector 246. Further, in the test signal detecting part 231, the received data RD are input to the CMP 238 via the FF 233. The CMP 238 compares the received data RD with a data pattern stored in the pattern table 236. The CMP 238 may compare the received data RD with, for example, the data pattern stored in the pattern table 237 corresponding to a pattern address specified by the sequencer 236. A comparison result from this CMP 238 is input to an input terminal ERROR of the sequencer 236. The sequencer 236 performs detection processing of test signal based on the comparison result input from the CMP 238.

Figure 23:
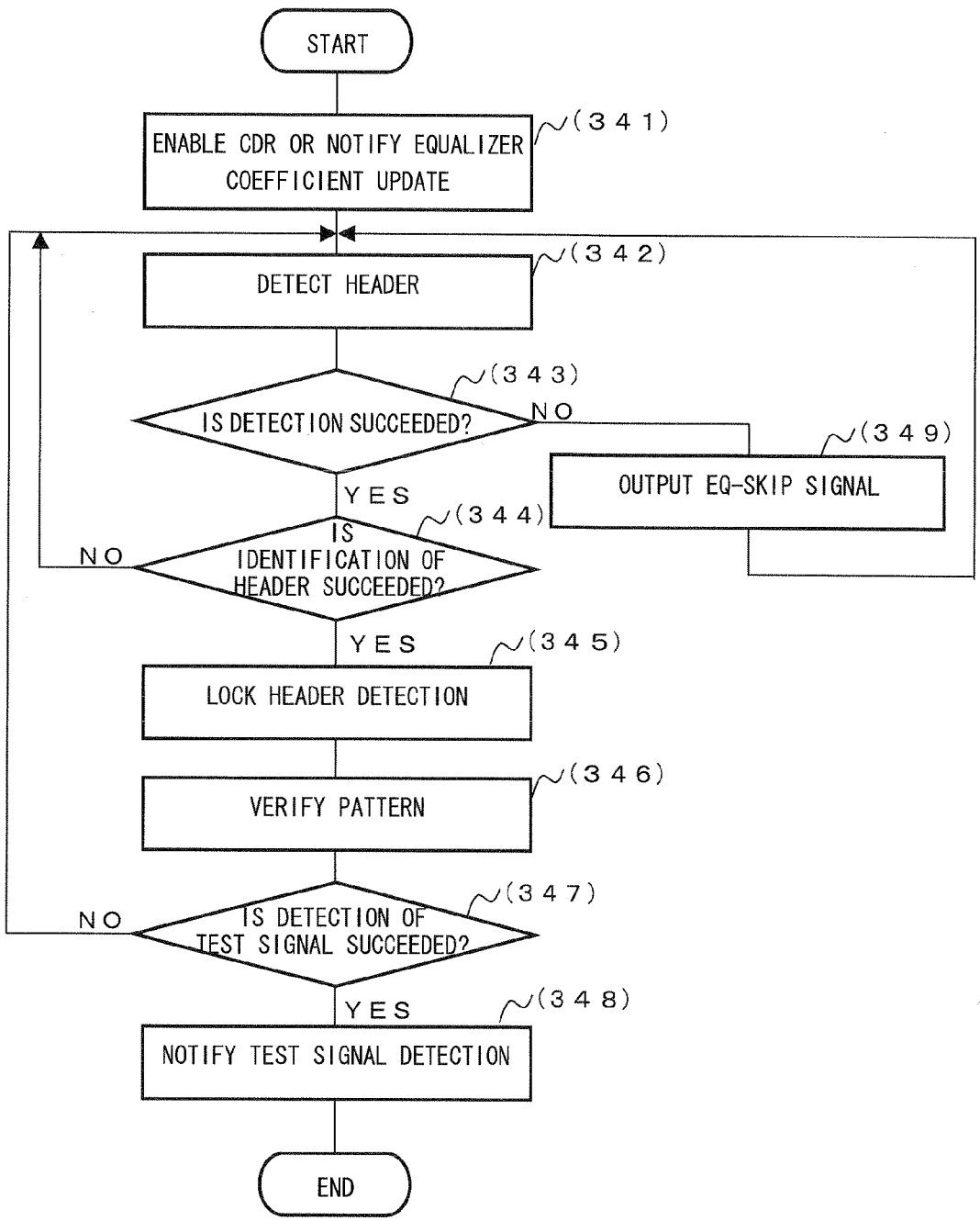
FIG. 23 is a flowchart representing test signal detecting operation.

FIG. 23 illustrates a flowchart representing operation of detecting a test signal. The flowchart illustrated in FIG. 23 illustrates an example of processing for stably detecting from a header arranged at the head of the test signal to the end thereof, when the test signal having a predetermined length is input repeatedly.

First, the sequencer 236 starts operation when CDR processing is enabled by the above-described CDR-en signal (step 341). Next, the sequencer 236 monitors, for example, output of the CMP 238 across a predetermined period corresponding to the iterative period of the test signal, so as to detect the header of the test signal (step 342). At this time, by the sequencer 236, for example, the pattern address specifying the header of the test signal is set to the pattern table 237. Accordingly, the header output from the pattern table 237 and the received data are verified by the CMP 238.

When a match between the received data and the data pattern corresponding to the header of the test signal is indicated by the output of the CMP 238, the sequencer 236 judges that the detection of header is succeeded (affirmative judgment in step 343).

In response to affirmative judgment in step 343, the sequencer 236 judges whether identification of the header is succeeded or not (step 344). For example, the sequencer 236 judges that identification of the header is succeeded when the above-described detection of header is succeeded $n_h$ times at time intervals corresponding to an iterative period of the test data (affirmative judgment in step 344). When step 344 results in negative judgment, processing returns to step 342 to perform the detection of header again.

On the other hand, when step 344 results in affirmative judgment, the sequencer 236 locks the header detection (step 345). Accordingly, in processing thereafter, the head of the iterative period of the test signal is fixed to the detection timing of the header identified in step 344. Next, the sequencer 236 verifies the data pattern of the test signal with the received data (step 346). At this time the sequencer 236 sets, for example, the pattern addresses specifying respective data patterns contained in the test signal to the pattern table 237 sequentially via an output terminal P-ADR. Thus, the CMP 238 can receive a data pattern as a verification target from the pattern table 237 in synchronization with input of the received data RD.

When the verification processing in step 346 is not succeeded, the sequencer 236 judges that the detection of test signal is failed (negative judgment in step 347). In this case, the sequencer 236 returns to step 342 to perform the detection processing of test signal again from the detection of header. On the other hand, when the above-described verification processing is succeeded $n_d$ times consecutively, the sequencer 236 judges that the detection of test signal is succeeded (affirmative judgment in step 347).

When this step 347 results in affirmative judgment, the sequencer 236 notifies the success of the detection of test signal to the test signal generating part 245 and the coefficient searching logic part 232 via the above-described path C3 (step 348). In the example of the test signal detecting part 231 illustrated in FIG. 22, a notification of the success of the detection of test signal is transmitted by operation as follows. First, in response to affirmative judgment in above-described step 347, the sequencer 236 inputs "1" to a set terminal of the SR-FF 235 via an output terminal PTN-OK. In response to this, by setting an output of the SR-FF 235 to "1", success of the detection of test signal is indicated. This output of the SR-FF 235 is transmitted to the test signal generating part 245 and the coefficient searching logic part 232 via the path C3.

Incidentally, when the header is not detected in the predetermined period in above-described step 342 (negative judgment in step 343), the sequencer 236 judges that the header detection is failed. In this case, processing proceeds to step 349. In step 349, the sequencer 236 outputs, for example, an EQ-SKIP signal of one-shot pulse via an output terminal EQ-SKIP for example. This EQ-SKIP signal is transmitted to the coefficient searching logic part 232 via the FF $234_3$ and a path C5 as a signal instructing update of the equalizer coefficient. The sequencer 236 returns to step 342 after the processing in step 349 is finished, and performs the detection processing of test signal from the header detection processing again.

Here, after the success of the detection of test signal is notified in step 348, the test signal detection processing by the sequencer 236 is finished once. Thereafter, when the equalizer coefficient is updated from the coefficient searching logic part 232, this update is notified to a control input terminal PTN-rst of the sequencer 236 via the above-described path C4. At this time, the sequencer 236 starts the test signal detection processing from above-described step 341 again. Further, in the test signal detecting part 231 illustrated in FIG. 22, the above-described path C4 is coupled to a reset terminal of the SR-FF 235. Therefore, the output of this SR-FF 235 is reset in response to the notification of the update of the equalizer coefficient.

In this manner, by the sequencer 236 illustrated in FIG. 22 controlling set/reset of the SR-FF 235 as described above, the PTN-OK signal indicating whether the detection of test signal is succeeded stably or not can be generated.

This PTN-OK signal is input to a set terminal of the SR-FF 251 provided in the test signal generating part 245 illustrated in FIG. 22 via the above-described path C3. Further, to a reset terminal of this SR-FF 251, the notification of the update of equalizer coefficient is input via the above-described path C4. Then, an output of this SR-FF 251 is input to a switching controlling terminal of the selector 246 via the FF 252. Further, the FF 253 illustrated in FIG. 22 turns to an enable state when an output of the SR-FF 251 is "1".

The address counter 254 of the test signal generating part 245 illustrated in FIG. 22 receives a P-START signal indicating start timing of the test signal from the sequencer 236. For example, the sequencer 236 may output the P-START signal indicating the header detection timing locked in step 345 illustrated in FIG. 23. This P-START signal is transmitted to the address counter 254 of the test signal generating part 245 via the FF $234_2$ and the path C6. Then, based on timing indicated by this P-START signal, the address counter 254 sequentially generates addresses indicating respective data patterns included in the test signal stored in the pattern table 255. Based on the addresses generated in this manner, the pattern table 255 sequentially outputs the respective data patterns included in the test signal.

The data patterns output from this pattern table 255 are input to one of input terminals of the selector 246 via the FF 253 which becomes enable in response to the above-described PTN-OK signal.

Thus, in the test signal generating part 245 illustrated in FIG. 22, the test signal synchronized with the received data can be generated by the address counter 254 and the pattern table 255 in response to success in detection of test signal.

The selector 246 illustrated in FIG. 22 selectively inputs the test signal generated by the test signal generating part 245 to the CDR controlling logic part 244 when "1" is input to the switching controlling terminal of this selector 246.

In addition, to a high speed interface unit to which the receiving device of the disclosure of the present application is applied, a logic circuit having a function to detect a test signal and a logic circuit having a function to generate a test signal are already mounted for product test, or the like. Therefore, the logic circuits already mounted in the high speed interface unit may be used as the test signal detecting part 231 and the test signal generating part 245 described above.

Thus, there is substantially no increase in circuit scale by adding the test signal detecting part 231 and the test signal generating part 245 illustrated in FIG. 19. The coefficient searching logic part 232 may also be achieved by a circuit scale which is substantially equal to the adaptive controlling logic part 229 illustrated in FIG. 18.

Figure 24:
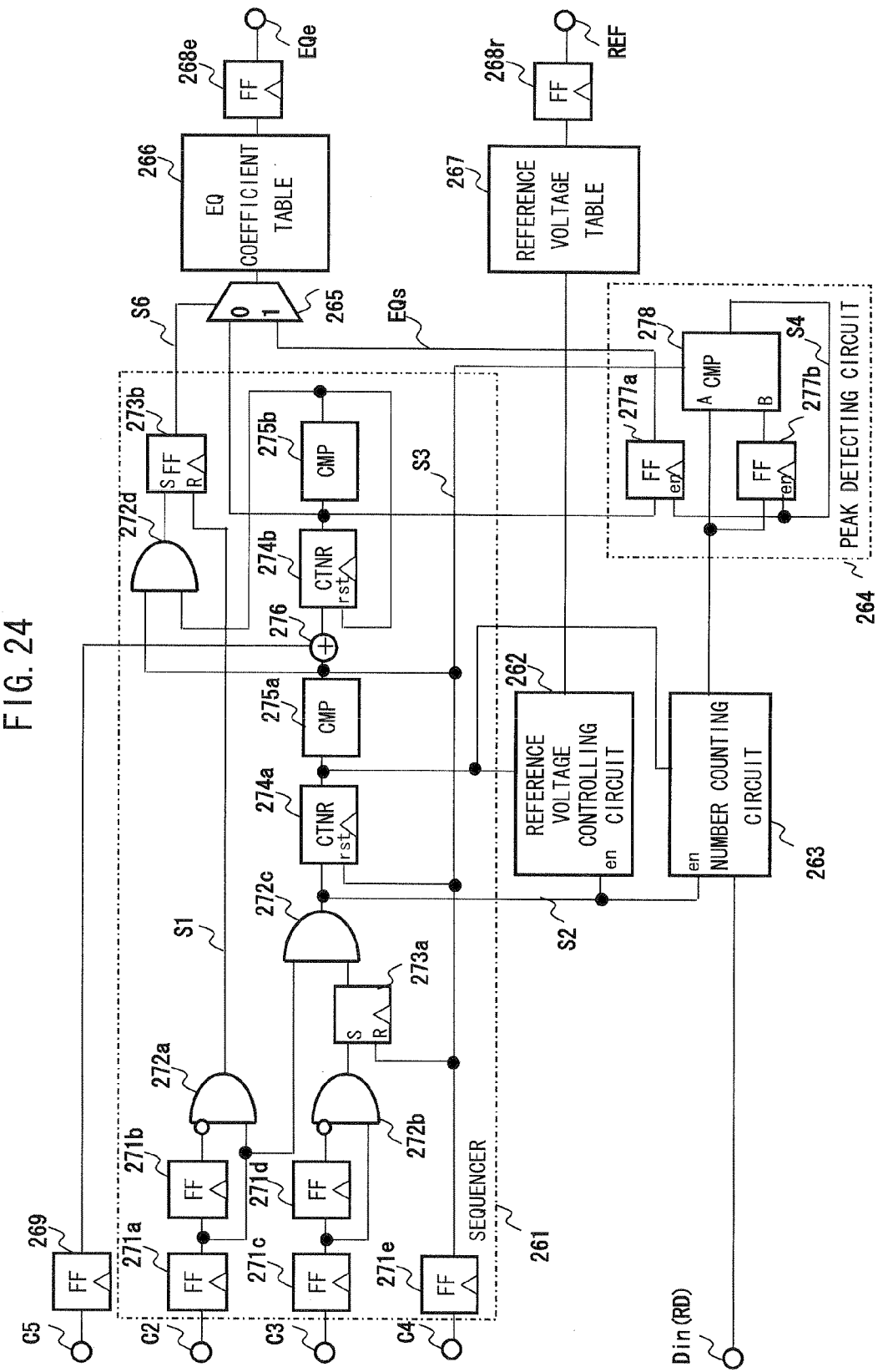
FIG. 24 is a diagram illustrating one embodiment of a coefficient searching logic part.
Figure 25:
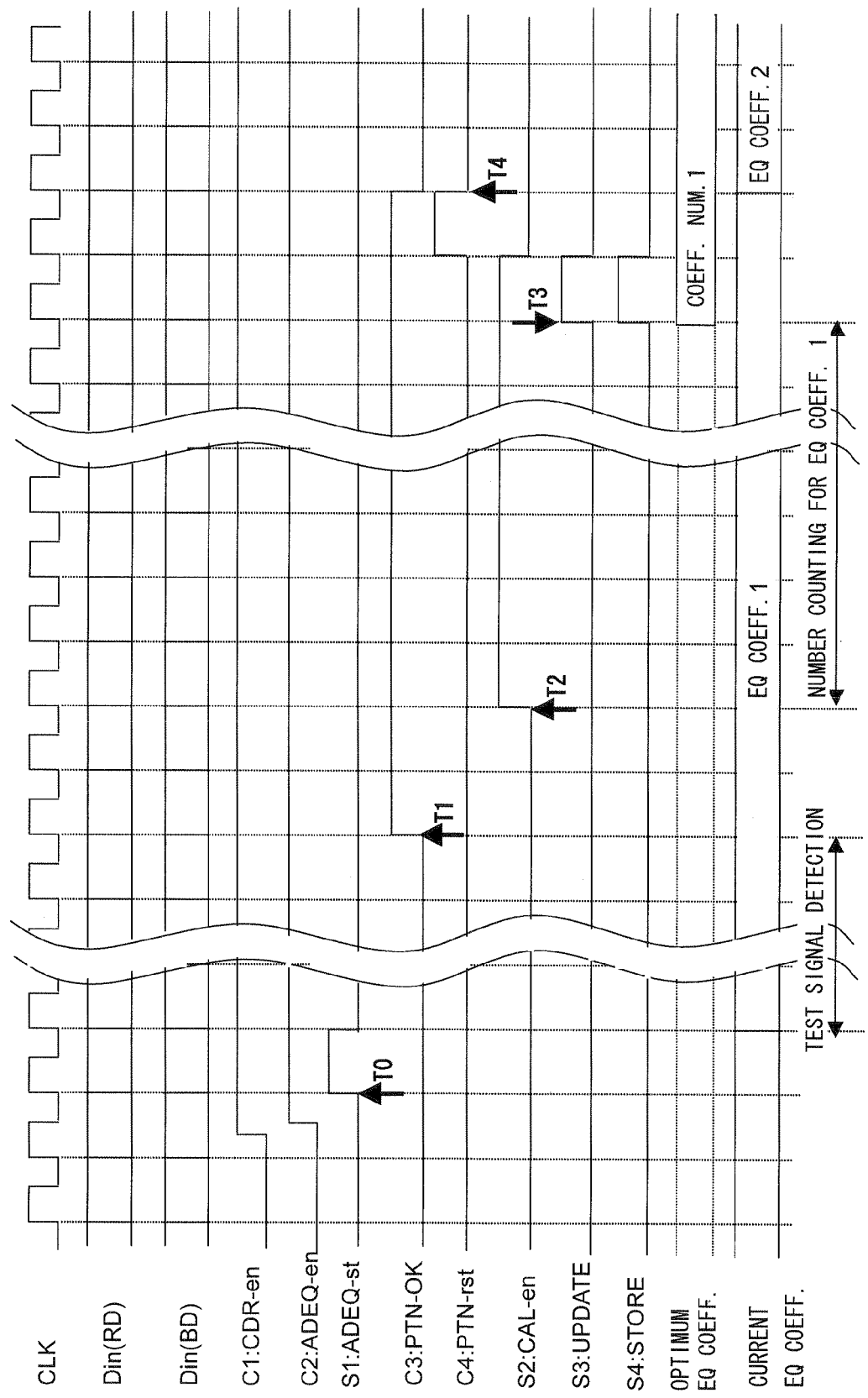
FIG. 25 is a timing chart (part 1) describing coefficient searching operation.
Figure 26:
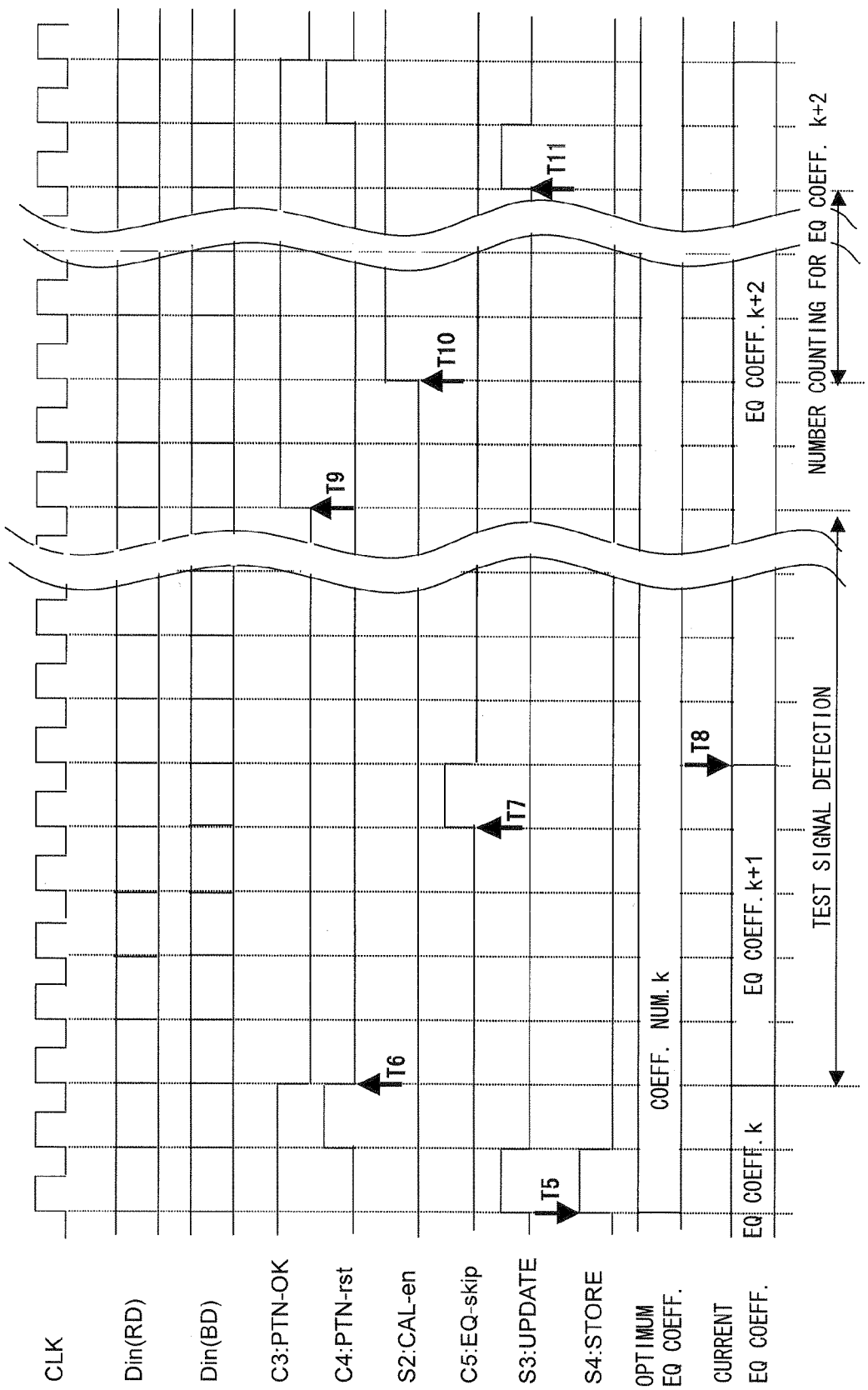
FIG. 26 is a timing chart (part 2) describing the coefficient searching operation.
Figure 27:
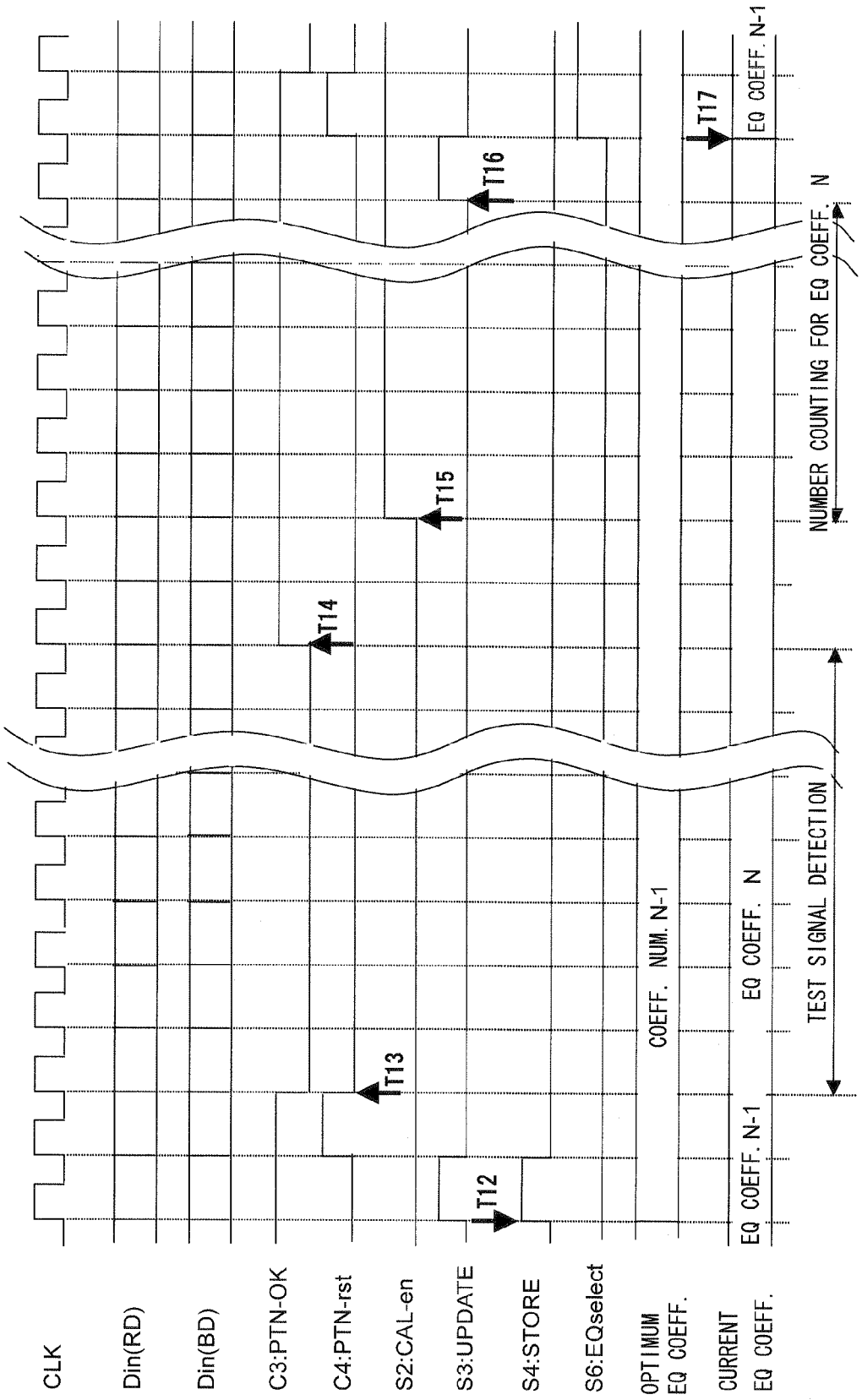
FIG. 27 is a timing chart (part 3) describing the coefficient searching operation.
Figure 28:
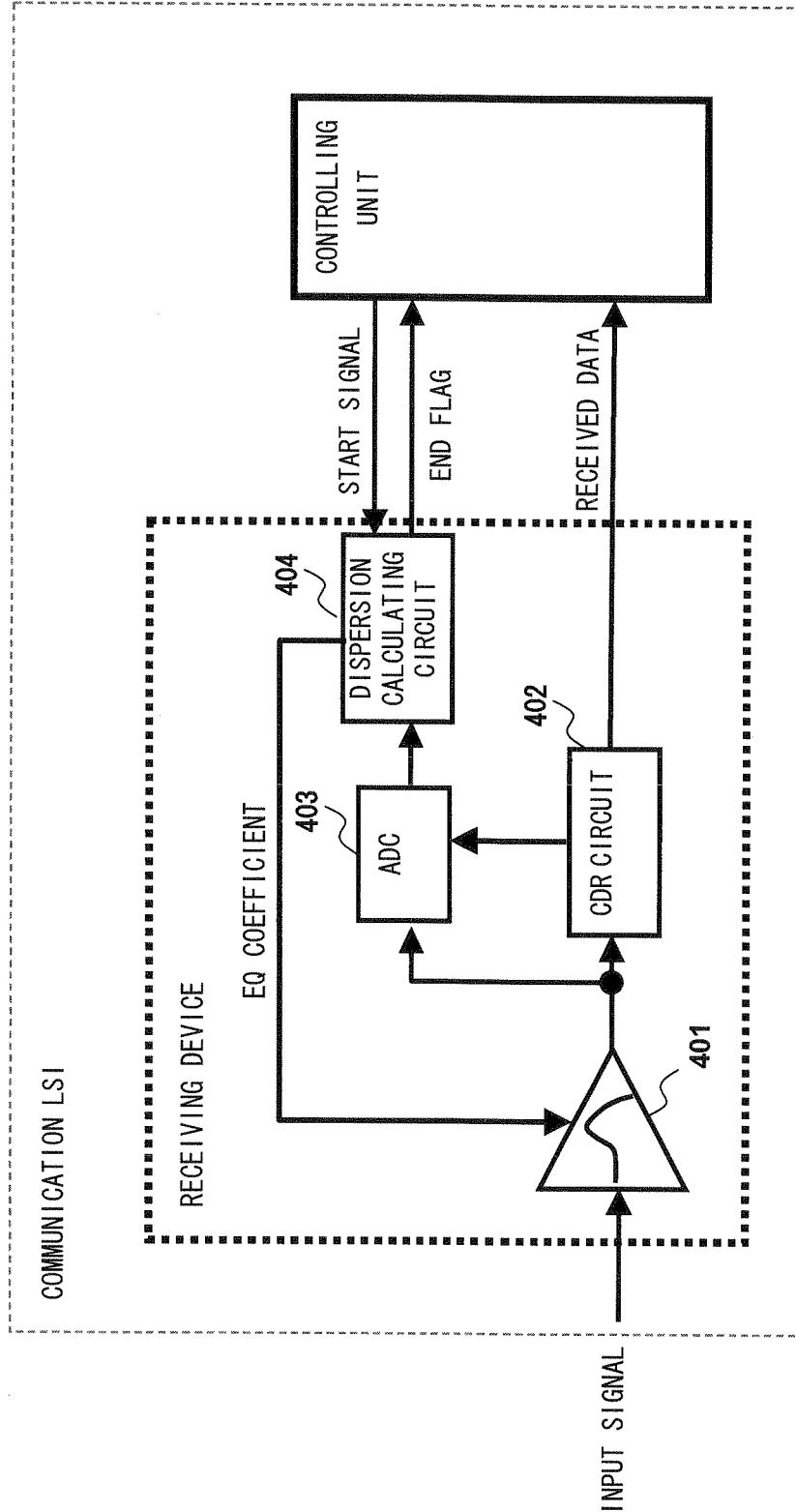
FIG. 28 is a diagram illustrating a structural example of a conventional receiving device having an adaptive equalizer.
Figure 29:
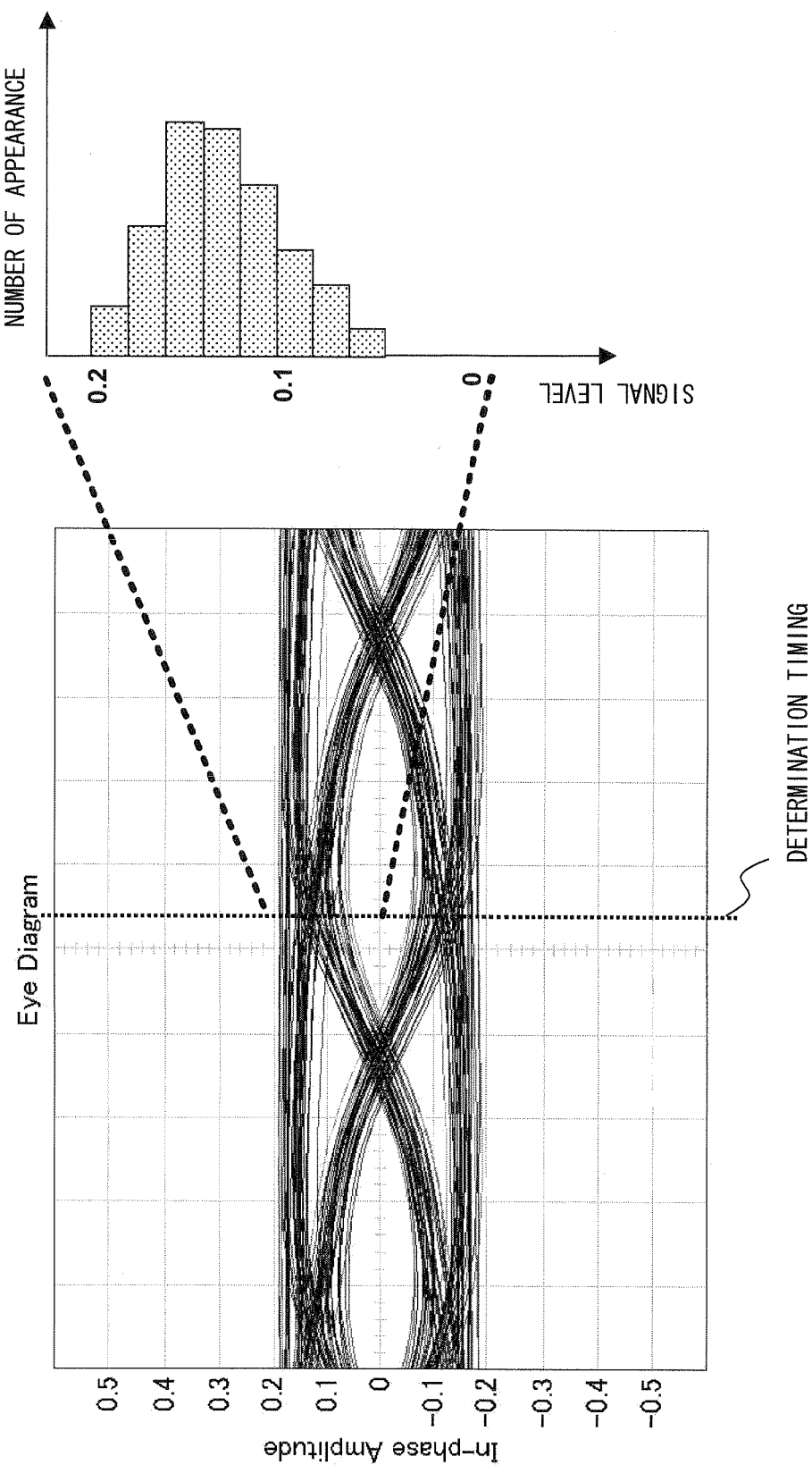
FIG. 29 is a diagram describing conventional adaptive equalizer alteration processing.

FIG. 24 illustrates one embodiment of the coefficient searching logic part. Note that among components illustrated in FIG. 24, components equivalent to those illustrated in FIG. 22 are denoted by the same symbols, and descriptions thereof are omitted. Further, FIG. 25 to FIG. 27 illustrate timing charts describing processing of searching for a coefficient.

The coefficient searching logic part 232 illustrated in FIG. 24 has a sequencer 261, a reference voltage controlling circuit 262, a number counting circuit 263, and a peak detecting circuit 264. This coefficient searching logic part 232 further has a selector 265, an equalizer (EQ) coefficient table 266, a reference voltage table 267, a FF 268e used for outputting the equalizer coefficient, a FF 268r used for outputting the REF controlling code, and another FF 269.

The reference voltage controlling circuit 262 illustrated in FIG. 24 generates an address specifying the REF controlling code based on a control signal from the sequencer 261. The REF controlling code is used for setting the reference voltage indicating the range of detection or the threshold for 0/1 determination. The address generated in the reference voltage controlling circuit 262 is input to the reference voltage table 267. Then, in response to input of this address, the REF controlling code is read out from the reference voltage table 267. The read REF controlling code is output from an output port REF via the FF 268r. This REF controlling code is further input to the reference voltage generator 215 illustrated in FIG. 19. The reference voltage generator 215 at the time the REF controlling code corresponding to the threshold for 0/1 determination is input operates as an example of a threshold-level generating part. Therefore, by the reference voltage controlling circuit 262 selectively outputting the REF controlling code corresponding to the range of detection and the REF controlling code corresponding to the threshold for 0/1 determination, the reference voltage to be input from the reference voltage generator 215 to the decision latches 221 is switched. That is, the circuit structure combining the reference voltage generator 215 and the reference voltage controlling circuit 262 is an example of a reference switching part.

Further, the number counting circuit 263 illustrated in FIG. 24 performs counting processing based on the received data RD input via the input port Din (RD) and the control signal from the sequencer 261. By this number counting circuit 263, the peak value of number distribution of sampling results are obtained as counting results corresponding to each equalizer coefficient. The obtained peak value is input to the peak detecting circuit 264.

Further, the sequencer 261 illustrated in FIG. 24 includes five FFs 271a to 271e, four AND gates 272a to 272d, and two SR-FFs 273a, 273b. Moreover, this sequencer 261 includes two counters (CTNR) 274a, 274b, and two comparators (CMP) 275a, 275b. Further, the peak detecting circuit 264 illustrated in FIG. 24 includes two FFs 277a, 277b and a comparator (CMP) 278. Note that illustration of clock signals to be input to the above-described circuit elements are omitted in the example illustrated in FIG. 24.

To an input terminal of the FF 271a illustrated in FIG. 24, the ADEQ-en signal is input via the above-described input terminal C2. Then, this FF 271a, and the FF 271b and the AND gate 272a in the subsequent stage generate an ADEQ-st signal (S1). To the AND gate 272a, an output of the FF 271a and an inverted output of the FF 271b are input. Therefore, the ADEQ-st signal (Si) becomes a one-shot pulse responding to rising of the ADEQ-en signal.

In the timing chart illustrated in FIG. 25, the rising timing of the ADEQ-en signal is asynchronous with a clock signal CLK synchronized with the received data RD and the boundary data BD. The ADEQ-st signal (S1) generated by the above-described FFs 271a, 271b and the AND gate 272a in response to input of such ADEQ-en signal becomes a one-shot pulse synchronized with the clock signal CLK at time T0.

This ADEQ-st signal (Si) is input to a reset terminal of the SR-FF 273b illustrated in FIG. 24. Therefore, in response to rising of the ADEQ-st signal (Si), an output of this SR-FF 273b is reset. The output of this SR-FF 273b (S6) is input to the selector 265 as a switching signal EQ-SELECT. When the switching signal EQ-SELECT is "0", the selector 265 illustrated in FIG. 24 selectively inputs to the EQ coefficient table 266 an output of the counter 274b which is input to an input terminal 0. Further, at the timing the above-described SR-FF 273b is reset, the FFs 268e, 268r and the FFs 277a, 277b provided in the peak detecting circuit 264 are cleared. Thereafter, the equalizer coefficient output from this EQ coefficient table 266 is output from an output port EQe via the FF 268e. The equalizer coefficient output in this manner is set to the equalizer 103.

In the example illustrated in FIG. 25, the EQ coefficient 1 corresponding to the initial value of the counter 274b is output from the output port EQe one clock later than time T0 at which the ADEQ-st signal (S1) rises. The above-described test signal detecting part 231 may start detecting operation of test signal after the EQ coefficient 1 is set to the equalizer 103 in this manner.

Further, in the example of FIG. 24, an input terminal of the FF 271c provided in the sequencer 261 is coupled to the above-described path C3. Then, this FF 271c, and the FF 271d and the AND gate 272b in the subsequent stage generate a one-shot pulse responding to rising of the PTN-OK signal input via the path C3.

An output of the above-described AND gate 272b is input to a set terminal of the SR-FF 273a. An output of this SR-FF 273a is input to one of input terminals of the AND gate 272c. To the other input terminal of the AND gate 272c, the output of the above-described FF 271a is input. Therefore, when the SR-FF 273a is set by the one-short pulse responding to rising of the PTN-OK signal, either of inputs to the AND gate 273c becomes "1". Thus, after the adaptive equalization control is enabled by the ADEQ-en signal, an output of the AND gate 273c changes to "1" in response to rising of the PTN-OK signal indicating success in detection of test signal. In the description below, this output of the AND gate 273c will be referred to as CAL-en signal. Further, this CAL-en signal is denoted by symbol S2 in FIG. 24.

In the timing chart illustrated in FIG. 25, when the PTN-OK signal rises at time T1 in response to success in detection of test signal, the CAL-en signal (S2) rises at time T2 which is two clock later than time T1.

This CAL-en signal (S2) is input to enable terminals en of the reference voltage controlling circuit 262 and the number counting circuit 263 illustrated in FIG. 24. Then, in response to rising of the CAL-en signal (S2), the reference voltage controlling circuit 262 and the number counting circuit 263 start reference voltage controlling operation for scanning a range of detection and number counting operation for each range of detection. For example, in the timing chart illustrated in FIG. 25, number counting processing for the EQ coefficient 1 currently set to the equalizer 103 is started in response to rising of the CAL-en signal (S2) at time T2.

Further, a count value of the above-described counter 274a is input as a control signal to the reference voltage controlling circuit 262 and the number counting circuit 263 illustrated in FIG. 24. For example, the reference voltage controlling circuit 262 may determine the timing or the like of switching the reference voltage for scanning the range of detection based on the received count value. Similarly the number counting circuit 263 may determine the timing of changing the reference voltage based on the received count value. Then, according to the result of this determination, number counting of each range of detection is performed.

Further, the counter 274a illustrated in FIG. 24 performs counting operation in synchronization with the clock signal CLK across a period in which the CAL-en signal (S2) maintains "1". The count value of this counter 274a is compared by the comparator 275a with a predetermined number M corresponding to a scanning period for a range of detection. When the count value of the counter 274a becomes equal to the predetermined value M, the output of the comparator 275a (53) becomes "1". This output of the comparator 275a (53) is input to a reset terminal of the above-described counter 274a. Accordingly, the output of the comparator 275a (S3) becomes a one-short pulse, which becomes "1" only for one clock in response to passing of the above-described scanning period.

This output of the comparator 275a (S3) is input to the counter 274b via an adder 276 as an UPDATE signal instructing update of the equalizer coefficient. This counter 274b counts pulses output from the adder 276. The EQ coefficient number indicated by a count value of this counter 274b is input to the input terminal 0 of the above-described selector 265, and also input to the FF 277a of the peak detecting circuit 264.

Further, at the timing the above-described UPDATE signal is "1", the comparator 278 of the peak detecting circuit 264 compares a counting result from the number counting circuit 263 with data stored in the FF 277b. At this time, the counting result from the number counting circuit 263 indicates the peak value N corresponding to the current EQ coefficient. Then, the comparator 278 compares this peak value N with the maximum peak value Np up to this point, which is stored in the FF 277b. An output of this comparator 278 (S4) is input as a STORE signal to enable terminals of the FFs 277a, 277b. Therefore, the FFs 277a, 277b turn to an enable state when the above-described STORE signal indicates that the peak value N corresponding to the current EQ coefficient is larger than the maximum peak value Np. Then, at this time, the count number indicating the current EQ coefficient indicated by the count value of the counter 274b and a new peak value N are stored in the FFs 277a, 277b, respectively.

In the timing chart illustrated in FIG. 25, the STORE signal becomes "1" in response to rising of the UPDATE signal at time T3. Then, in response to this STORE signal, an EQ coefficient number 1 corresponding to the current EQ coefficient is stored in the FF 277a as a coefficient number indicating the optimum EQ coefficient.

Further, in the sequencer 261 illustrate in FIG. 24, the output of the SR-FF 273a is reset by the above-described UPDATE signal. Accompanying this, the CAL-en signal (S2) changes to "0". In response to this change in the CAL-en signal (S2), counting operation of the counter 274a as well as operation of the reference voltage controlling circuit 262 and the number counting circuit 263 are inhibited. Further, the above-described UPDATE signal is input to the FF 271e. Then, an output of this FF 271e is transmitted to the test signal detecting part 231 and the test signal generating part 245 as the PTN-rst signal via the path C4.

The timing chart illustrated in FIG. 25 illustrates that the UPDATE signal is delayed by one clock and output as the PTN-rst signal by the FF 271e. Accordingly, the PTN-OK signal is reset at time T4 which is two clocks later than rising of the UPDATE signal. Thus, the timing to start detection of test signal and timing to update the current EQ coefficient output from the output port EQe are matched.

The sequencer 261 illustrated in FIG. 24 includes a circuit structure to increment the counter 274b in response to the EQ-SKIP signal. Thus, processing of skipping the number counting processing for the corresponding EQ coefficient in response to failure in detection of test signal is achieved.

The EQ-SKIP signal generated in the test signal detecting part 231 in response to failure in detection of test signal is input to the adder 276 via the FF 269 having an input coupled to the path C5. The counter 274b performs counting operation based on an output of this adder 276. Therefore, the count value of the counter 274b is added up in response to arrival of the EQ-SKIP signal, similarly to when the pulse from the above-described comparator 275a arrives.

In the example illustrated in FIG. 26, after the new coefficient number k+1 is set at time T6, in response to the EQ-SKIP signal arriving at time T7 the EQ coefficient is updated to coefficient number k+2 at time T8. In this case, the test signal detection processing is continued regardless of the update of the EQ coefficient. That is, at time T8 and thereafter, the test signal is detected from received data obtained from an output of the equalizer 103 to which EQ coefficient k+2 is applied.

Here, in the example of FIG. 26, when the coefficient number indicating the EQ coefficient is updated from the coefficient number k to the coefficient number k+1 in response to the UPDATE signal, the coefficient number k is stored in the above-described FF 277a at time T5 as the coefficient number indicating the optimum EQ coefficient. This optimum EQ coefficient and the maximum peak value Np stored correspondingly in the FF 277b are maintained as they are regardless of processing accompanying input of the above-described EQ-SKIP signal. Then, in response to rising of the PTN-OK signal at time T9, number counting processing for the EQ coefficient k+2 is started at time T10. When the peak value N obtained in this number counting processing is equal to or less than the above-described maximum Np, the STORE signal remains to be "0" and does not change regardless of a change in the UPDATE signal illustrated at time T11 of FIG. 26. In such case, processing for the next EQ coefficient is started while maintaining the coefficient number k as the coefficient number indicating the optimum EQ coefficient.

Further, there is included a circuit structure to switch the selector 265 using the sequencer 261 and the output of the comparator 275b illustrated in FIG. 24. With this circuit structure, processing of setting the optimum EQ coefficient to the equalizer 103 after completion of number counting processing for all the EQ coefficients is achieved.

Upon completion of number counting processing for the last EQ coefficient N, the count value of the counter 274a becomes "N+1" in response to a change in the UPDATE signal. At this time, the comparator 275b changes the output to "1" to indicate that the count value of the counter 274a has exceeded the total number N of EQ coefficients. At this time, an output of the AND gate 272d to which both the outputs of the two comparators 275a, 275b are input becomes "1". Then, in response to this change in output of the AND gate 272d, the output of the SR-FF 273b (S6) is set. In this manner, the EQ-SELECT input to the selector 265 is switched to "1" along with determination of the optimum EQ coefficient. After this EQ-SELECT signal is switched, an output of the FF 277a input to an input terminal 1 of the selector 265 is input selectively to the EQ coefficient table 266. That is, the coefficient number indicating the optimum EQ coefficient stored in the FF 277a is input to the EQ coefficient table 266 via the selector 265. Accordingly, the EQ coefficient output from the EQ coefficient table 266 is fixed to the EQ coefficient corresponding to the coefficient number stored in the FF 277a.

In the timing chart illustrated in FIG. 27, in response to changes in UPDATE signal and STORE signal at time T12, the coefficient number N-1 is stored in the FF 277a corresponding to the optimum EQ coefficient. Thereafter, in response to falling of the PTN-rst signal, test signal detection processing in a state that the EQ coefficient N indicated by the coefficient number N is applied to the equalizer 103 is performed from time T13. Then, in response to rising of the PTN-OK signal at time T14, number counting processing for the EQ coefficient N is started from time T15. When the peak value obtained in this number counting processing is equal to or less than the above-described maximum peak value Np stored corresponding to the above-described optimum EQ coefficient, the STORE signal remains to be "0" and does not change regardless of a change in the UPDATE signal illustrated at time T16. Therefore, the coefficient number N-1 stored in the FF 277a at above-described time T12 is maintained as it is. Then, when the EQ-SELECT signal changes to "1" at time T17, the EQ coefficient N-1 corresponding to this coefficient number N-1 is set to the equalizer 103.

As described above, in the coefficient searching logic part 232 as illustrated in FIG. 24, number counting processing for the current EQ coefficient can be performed in response to a success in detection of test signal. In the sequencer 261 illustrated in FIG. 24, based on the PTN-OK signal, PTN-rst signal, and EQ-SKIP signal transmitted to/received from the test signal detecting part 231, operation control of the reference voltage controlling circuit 262 and the number counting circuit 263 is performed. As can be seen from FIG. 24, based on these signals, the circuit for generating operation control timings of the reference voltage controlling circuit 262 and the number counting circuit 263 are achieved by several FFs and AND gates. Thus, the coefficient searching logic part 232 used for a receiving device which shares the comparators $221_{D0}$, $221_{D1}$ for obtaining received data as illustrated in FIG. 19 can also be achieved with a small-scale circuit.

Note that also in the coefficient searching logic part applied to the receiving device illustrated in FIG. 19, there may be applied control to limit the scanning zone of ranges of detection to the voltage range corresponding to a received signal indicating received data of "1". Such control is achieved by, for example, the number counting circuit 263 selectively performing counting processing when the test signal is "1", using the test signal generated in the test signal generating part.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving device, comprising:
an equalizer circuit shaping a waveform of an input signal according to an equalizer coefficient being set;
a CDR (clock data recovery) circuit recovering, from the input signal being shaped by the equalizer circuit, received data represented by the input signal and a clock signal which indicates a determination timing of the received data;
a number counting part counting, in a range of detection having a predetermined width, a sampling result obtained by sampling the input signal being shaped by the equalizer circuit at the determination timing;
a zone scanning part scanning the range of detection in a scanning zone including a variation range of a voltage value of the input signal;
a coefficient altering part altering the equalizer coefficient set to the equalizer circuit;
a peak detecting part detecting a peak value of a number of appearances of the sampling result based on a change in a counting result obtained by the number counting part according to the alteration of the equalizer coefficient and the scanning of the range of detection; and
a coefficient specifying part specifying the equalizer coefficient being set to the equalizer circuit when detecting the peak value in the peak detecting part as a first coefficient.

2. The receiving device according to claim 1, further comprising
an alteration controlling part instructing the coefficient altering part to alter the equalizer coefficient based on a comparison between the received data represented by the input signal and a test signal having a known data pattern.

3. The receiving device according to claim 1, wherein:
the CDR circuit comprises a test signal generating part generating a test signal having a known data pattern based on the clock signal, and performs, in a time-division manner, clock recovery processing using the test signal being generated in the test signal generating part and clock recovery processing using a comparison result between the sampling result of the input signal and a predetermined first threshold;
the zone scanning part performs scanning of the range of detection in a first phase in which a clock recovery using the test signal is performed in the CDR circuit; and
the number counting part performs counting of the sampling result in the range of detection being scanned by the zone scanning part in the first phase.

4. The receiving device according to claim 3, further comprising
a threshold-level generating part generating a voltage corresponding to the predetermined first threshold in a second phase in which the clock recovery is performed using the comparison result between the sampling result of the input signal and the predetermined first threshold in the CDR circuit, wherein
the number counting part comprises:
a decision latch comparing an output of the equalizer circuit being sampled at the determination timing with a reference voltage; and
a reference switching part inputting a voltage corresponding to the range of detection being scanned by the zone scanning part as the reference voltage to the decision latch in the first phase, and inputting the voltage generated in the threshold-level generating part as the reference voltage to the decision latch in the second phase.

5. The receiving device according to claim 1, wherein:
the zone scanning part scans the range of detection by changing, at every predetermined time, an upper-limit reference voltage indicating an upper limit of the range of detection for the number counting part and a lower-limit reference voltage indicating a lower limit of the range of detection for the number counting part; and
the number counting part comprises
an upper-limit comparator comparing the sampling result with the upper-limit reference voltage,
a lower-limit comparator comparing the sampling result with the lower-limit reference voltage, and
a range counter selectively counting the sampling result equal to or less than the upper-limit reference voltage and equal to or more than the lower-limit reference voltage based on a comparison result of the upper-limit comparator and a comparison result of the lower-limit comparator.

6. The receiving device according to claim 1, wherein:
the zone scanning part scans the range of detection by changing, at every predetermined time, an upper-limit reference voltage indicating an upper limit of the range of detection for the number counting part and a lower-limit reference voltage indicating a lower limit of the range of detection for the number counting part;

the number counting part comprises
- an outrange detector performing, in a time-division manner, a detection of the sampling result having a value larger than the upper-limit reference voltage and a detection of the sampling result having a value smaller than the lower-limit reference voltage,
- an outrange counter counting a number of times the sampling result being detected by the outrange detector, and
- an index calculating part obtaining, based on a count value being obtained by the outrange counter, a number of appearances of a sampling result distributed outside the range of detection, as an index indirectly indicating a number of appearances of a sampling result having a value within the range of detection; and the peak detecting part indirectly detecting a peak value of the number of appearances of the sampling result by detecting a minimum value of the number of appearances of the sampling result distributed outside the range of detection being obtained by the index calculating part.

7. The receiving device according to claim 1, wherein:
the zone scanning part scans the range of detection by changing, at every predetermined time and by a voltage value corresponding to a width of the range of detection, a reference voltage indicating one of an upper value and a lower value of the range of detection; and
the number counting part comprises
- a discriminating part comparing the sampling result with the reference voltage and discriminating a sampling result which is equal to or larger than the reference voltage for each of cases when the reference voltage is an upper limit of the range of detection and when the reference voltage is a lower limit of the range of detection,
- a counter counting the sampling result being discriminated by the discriminating part by each of maintaining periods in which the reference voltage compared with the sampling result in the discriminating part is maintained,
- a memory which is updated by a counting result of the counter in each of the maintaining periods, and
- a number calculating part calculating, based on a difference between a counting result obtained corresponding to a new maintaining period by the counter and a counting result corresponding to a previous maintaining period stored in the memory, a number of appearances of a sampling result included in a range of detection indicated by a reference voltage corresponding to the previous maintaining period and a reference voltage corresponding to the new maintaining period.

8. The receiving device according to claim 1, wherein:
the coefficient altering part sequentially generates the equalizer coefficient which is capable of being set to the equalizer circuit, and maintains the equalizer coefficient during a period in which the range of detection is scanned in the scanning zone by the zone scanning part;
the peak detecting part comprises
- a peak value storing part storing the peak value being detected, and
- a peak updating part updating, when a counting result by the number counting part is larger than the peak value stored in the peak value storing part, the peak value being stored in the peak value storing part with the counting result; and the coefficient specifying part comprises
- a coefficient storing part which is to store an optimum equalizer coefficient, and
- a coefficient updating part updating, when the peak value storing part is updated by the peak updating part, the optimum equalizer coefficient being stored in the coefficient storing part with the equalizer coefficient being set to the equalizer circuit by the coefficient altering part.

9. The receiving device according to claim 1, wherein:
the equalizer circuit comprises
- at least one of a variable capacitor including a plurality of capacitors and a variable resistor including a plurality of resistor elements, and
- a configuration changing part changing at least one of a capacitance value of the variable capacitor and a resistance value of the variable resistor according to a controlling code corresponding to the equalizer coefficient; and the coefficient altering part sequentially generates a controlling code corresponding to at least one of all capacitance values achievable by the variable capacitor provided in the equalizer circuit and all resistance values achievable by the variable resistor provided in the equalizer circuit.

10. A receiving method, comprising:
sampling an input signal shaped by an equalizer circuit at a predetermined determination timing;
performing processing of counting the sampling result in a range of detection having a predetermined width which being scanned in a scanning zone including a variation range of a voltage value of the input signal every time an equalizer coefficient set to the equalizer circuit is altered; and
performing an optimum control of the equalizer coefficient based on a change in a counting result obtained in the processing of counting according to the alteration of the equalizer coefficient and the scanning of the range of detection.

11. The receiving method according to claim 10, further comprising:
verifying received data being recovered based on the sampling result with a test signal having a known data pattern every time the equalizer coefficient is altered; and
skipping the processing of counting the sampling result in the each range of detection when the received data and the test signal do not match.

12. The receiving method according to claim 10, further comprising:
performing, in response to the alteration of the equalizer coefficient, processing of recovering received data represented by the input signal and a clock signal which indicates a determination timing of the received data from the input signal being shaped by the equalizer circuit by a CDR (clock data recovery) circuit; and
performing the processing of counting the sampling result in the each range of detection after the processing of recovering the clock signal is performed by the CDR circuit, wherein
the processing of recovering the clock signal by the CDR circuit is performed based on a test signal generated based on the clock signal in a period in which the processing of counting the sampling result is performed.

* * * * *